(12) United States Patent
Higo et al.

(10) Patent No.: US 9,293,692 B2
(45) Date of Patent: *Mar. 22, 2016

(54) STORAGE ELEMENT AND MEMORY

(71) Applicant: Sony Corporation, Tokyo (JP)

(72) Inventors: Yutaka Higo, Miyagi (JP); Masanori Hosomi, Kanagawa (JP); Kazuhiro Bessho, Kanagawa (JP); Tetsuya Yamamoto, Kanagawa (JP); Hiroyuki Ohmori, Kanagawa (JP); Kazutaka Yamane, Miyagi (JP); Yuki Oishi, Kanagawa (JP); Hiroshi Kano, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 196 days.

This patent is subject to a terminal disclaimer.

(21) Appl. No.: 14/017,779

(22) Filed: Sep. 4, 2013

(65) Prior Publication Data
US 2014/0001587 A1  Jan. 2, 2014

Related U.S. Application Data

(63) Continuation of application No. 11/564,595, filed on Nov. 29, 2006, now Pat. No. 8,575,711.

(30) Foreign Application Priority Data

Dec. 1, 2005  (JP) ................................. 2005-348112

(51) Int. Cl.
*H01L 43/00* (2006.01)
*H01L 43/02* (2006.01)
(Continued)

(52) U.S. Cl.
CPC ................. *H01L 43/02* (2013.01); *B82Y 10/00* (2013.01); *B82Y 25/00* (2013.01); *H01L 27/228* (2013.01); *H01L 43/08* (2013.01); *H01L 43/10* (2013.01)

(58) Field of Classification Search
CPC ....................................................... H01L 29/82
USPC .................................................. 257/421, 422
See application file for complete search history.

(56) References Cited

U.S. PATENT DOCUMENTS 6,754,100 B1    6/2004 Hayakawa
8,575,711 B2 *  11/2013 Higo et al. .................... 257/421
(Continued)

FOREIGN PATENT DOCUMENTS

JP    2001-156357    6/2001
JP    2004-063592    2/2004
(Continued)

OTHER PUBLICATIONS

U.S. Appl. No. 14/045,055, Higo et al., Oct. 3, 2013.*
(Continued)

*Primary Examiner* — Samuel Gebremariam
(74) *Attorney, Agent, or Firm* — Dentons US LLP

(57) ABSTRACT

A storage element including a storage layer configured to hold information by use of a magnetization state of a magnetic material, with a pinned magnetization layer being provided on one side of the storage layer, with a tunnel insulation layer, and with the direction of magnetization of the storage layer being changed through injection of spin polarized electrons by passing a current in the lamination direction, so as to record information in the storage layer, wherein a spin barrier layer configured to restrain diffusion of the spin polarized electrons is provided on the side, opposite to the pinned magnetization layer, of the storage layer; and the spin barrier layer includes at least one material selected from the group composing of oxides, nitrides, and fluorides.

18 Claims, 11 Drawing Sheets

(51) Int. Cl.
*B82Y 10/00* (2011.01)
*B82Y 25/00* (2011.01)
*H01L 27/22* (2006.01)
*H01L 43/08* (2006.01)
*H01L 43/10* (2006.01)

(56) References Cited

U.S. PATENT DOCUMENTS

2004/0144995 A1 7/2004 Nagahama et al.
2005/0019610 A1 1/2005 Fujikata et al.
2005/0254287 A1 11/2005 Valet
2006/0141640 A1 6/2006 Huai et al.

FOREIGN PATENT DOCUMENTS

JP 2004-172599 6/2004
JP 2009-512204 3/2009
WO 2004/029973 4/2004

OTHER PUBLICATIONS

Japanese Office Action issued in connection with counterpart JP application No. 2005-348112 dated Apr. 10, 2012.

* cited by examiner

PRIOR ART  FIG.17
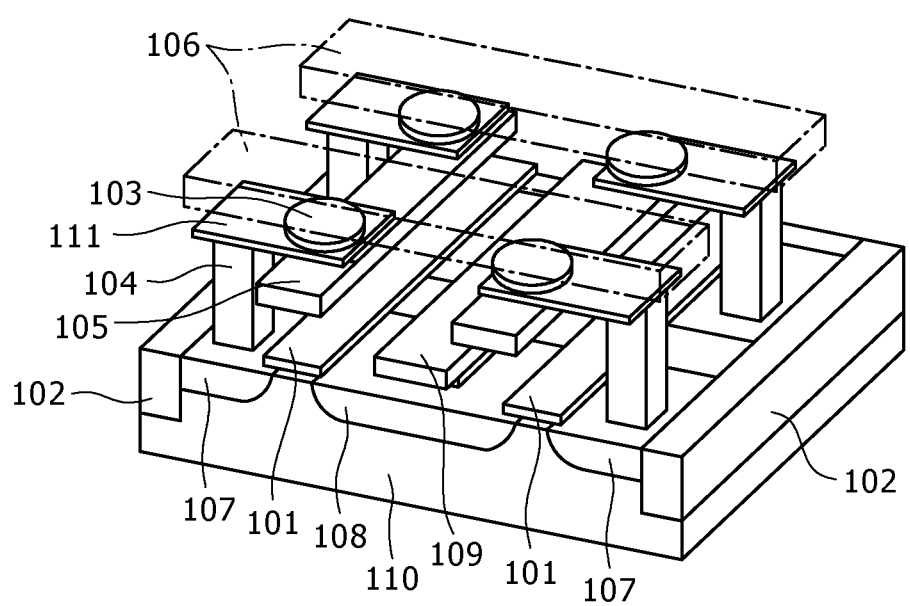

US 9,293,692 B2

STORAGE ELEMENT AND MEMORY

CROSS REFERENCES TO RELATED APPLICATIONS

This application is a continuation of U.S. patent application Ser. No. 11/564,595 filed Nov. 29, 2006, the entirety of which is incorporated herein by reference to the extent permitted by law. The present invention contains subject matter related to Japanese Patent Application JP 2005-348112 filed with the Japanese Patent Office on Dec. 1, 2005, the entire contents of which being incorporated herein by reference.

BACKGROUND OF THE INVENTION

1. Field of the Invention

The present invention relates to a storage element including a storage layer for storing a magnetization state of a ferromagnetic layer as information, and a pinned magnetization layer with its magnetization direction fixed, wherein the direction of magnetization of the storage layer is changed through injection of spin polarized electrons therein by passing a current in a direction perpendicular to the film plane, and to a memory including the storage elements. The present invention is favorably applicable to nonvolatile memories.

2. Description of the Related Art

In information apparatuses such as computers, high-operating-speed and high-density DRAMs are widely used as random access memories (RAMs).

However, the DRAMs are volatile memories which loose information when the power supply is turned off and, therefore, nonvolatile memories which do not loose information even upon turning-off of the power supply are desired.

As a candidate for a nonvolatile memory, the magnetic random access memory (MRAM) operative to record information by use of magnetization of a magnetic material has been paid attention to, and development thereof has been progressing (refer to, for example, Nikkei Electronics, 2001. 2. 12, pp. 164 to 171).

The MRAM is a memory in which electric currents are passed through two kinds of address wirings (word lines and bit lines) substantially orthogonally intersecting each other, and the magnetization of a magnetic layer of magnetic storage elements located at intersections between the address wirings is reversed by current-induced magnetic fields generated from the address wirings, thereby recording information.

Besides, reading of the information is achieved by use of the so-called magnetoresistance effect (MR effect) in which resistance varies according to the direction of magnetization of the storage layer in the magnetic storage elements.

A schematic diagram (perspective view) of a general MRAM is shown in FIG. 17.

A drain region 108, a source region 107, and a gate electrode 101 which constitute a selection transistor for selecting a memory cell are formed at a portion, isolated by an element isolation layer 102, of a semiconductor substrate 110 such as a silicon substrate.

In addition, a word line 105 extending in the front-rear direction in the figure is provided on the upper side of the gate electrode 101.

The drain region 108 is formed in common for the selection transistors arranged on the left and right sides in the figure, and a wiring 109 is connected to the drain region 108.

A magnetic storage element 103 having a storage layer of which the direction of magnetization can be reversed is disposed between the word line 105 and a bit line 106 located on the upper side and extending in the left-right direction in the figure. The magnetic storage element 103 is composed, for example, of a magnetic tunnel junction element (MTJ element).

Further, the magnetic storage element 103 is electrically connected to the source region 107 through a bypass line 111 extending in a horizontal direction and a contact layer 104 extending in the vertical direction.

When currents are passed through the word line 105 and the bit line 106, current-induced magnetic fields are applied to the magnetic storage element 103, with the result of reversal of the magnetization direction of the storage layer in the magnetic storage element 103, whereby information can be recorded.

In a magnetic memory such as an MRAM, for stable holding of the information recorded therein, it may be necessary that the magnetic layer (storage layer) for recording information has a fixed coercive force.

On the other hand, for rewriting the recorded information, it may be necessary to pass currents on a certain level in the address wirings.

However, attendant on the miniaturization of the elements constituting the MRAM, the address wirings are reduced in sectional size, so that it becomes difficult to pass sufficient currents in the address wirings.

In view of this, as a configuration capable of magnetization reversal by smaller currents, a memory designed to utilize magnetization reversal by spin injection has been attracting attention (refer to, for example, Japanese Patent Laid-open No. 2003-17782).

The magnetization reversal by spin injection means a process in which electrons having undergone spin polarization by passing through a magnetic material are injected into another magnetic material to thereby cause magnetization reversal in the another magnetic material.

For example, by a process in which a current is passed in a giant magnetoresistance effect element (GMR element) or a magnetic tunnel junction element (MTJ element) in the direction perpendicular to the film plane of the element, it is possible to reverse the magnetization direction of a magnetic layer at least a part of the element.

In addition, the magnetization reversal by spin injection is advantageous in that the magnetization reversal can be realized with small currents even when the elements are miniaturized.

Schematic diagrams of a memory configured to utilize the magnetization reversal by spin injection as above-mentioned are shown in FIGS. 15 and 16. FIG. 15 is a perspective view and FIG. 16 is a sectional view.

A drain region 58, a source region 57, and a gate electrode 51 which constitute a selection transistor for selecting a memory cell are formed at a portion, isolated by an element isolation layer 52, of a semiconductor substrate 60 such as a silicon substrate. Of these components, the gate electrode 51 functions also as a word line extending in the front-rear direction in FIG. 15.

The drain region 58 is formed in common for selection transistors arranged on the left and right sides in FIG. 15, and a wiring 59 is connected to the drain region 58.

A storage element 53 having a storage layer of which the direction of magnetization can be reversed by spin injection is disposed between the source region 57 and a bit line 56 disposed on the upper side and extending in the left-right direction in FIG. 15.

The storage element 53 is composed, for example, of a magnetic tunnel junction element (MTJ element). Symbols 61 and 62 in the figure denote magnetic layers; of the two magnetic layers 61 and 62, one is a pinned magnetization layer of which the magnetization direction is fixed, while the other is a free magnetization layer, or storage layer, of which the magnetization direction can be changed.

In addition, the storage element 53 is connected to the bit line 56 and the source region 57 through upper and lower contact layers 54, respectively. This ensures that the magnetization direction of the storage layer in the storage element 53 can be reversed through spin injection by passing a current in the storage element 53.

As compared with the general MRAM shown in FIG. 17, the memory designed to utilize the magnetization reversal by spin injection as just-mentioned has also the characteristic feature that the device structure (element structure) can be simplified.

In addition, as compared with the general MRAM in which magnetization reversal is conducted by use of an external magnetic field, the memory utilizing the magnetization reversal by spin injection is advantageous in that the write current is not increased even upon a progress in miniaturization of the elements.

Meanwhile, in the case of the MRAM, the write wirings (word line and bit line) are provided separately from the storage element, and information is written (recorded) by use of the current-induced magnetic field generated by passing currents through the write wirings. Therefore, the currents necessary for writing can be sufficiently passed in the write wirings.

On the other hand, in the memory configured to utilize the magnetization reversal by spin injection, it may be necessary to reverse the magnetization direction of the storage layer by spin injection effected by the current passed in the storage element.

Since the writing (recording) of information is carried out by passing a current or currents directly in the storage element, a memory cell is configured by connecting the storage element to the selection transistor, for selecting the memory cell in which to write the information. In this case, the current flowing in the storage element is limited by the quantity of the current which can be passed through the selection transistor (the saturation current of the selection transistor).

Therefore, it may be necessary to write information with a current smaller of not more than the saturation current of the selection transistor and, hence, to reduce the current to be passed in the storage element by improving the efficiency of spin injection.

Besides, for enlarging the read current, it may be necessary to secure a high magnetoresistance variation ratio; for this purpose, a storage element configuration in which intermediate layers in contact with both sides of the storage layer are tunnel insulation layers (tunnel barrier layers) is effective.

In the case where the tunnel insulation layer is thus used as the intermediate layer, the current passed in the storage element is limited, due to the need to prevent dielectric breakdown of the tunnel insulation layer. From this viewpoint also, it may be necessary to suppress the current at the time of spin injection.

Therefore, in the storage element configured to reverse the magnetization direction of the storage layer by spin injection, it may be necessary to improve the spin injection efficiency and thereby to reduce the current needed for writing information.

SUMMARY OF THE INVENTION

Generally, in the case of configuring a storage element by use of a magnetoresistance effect element such as an MTJ element and a GMR element, the storage layer is connected to a pinned magnetization layer through a tunnel insulation layer, and, in this case, a non-magnetic metallic layer such as an electrode layer for passing a current in the storage element is connected to the side, opposite to the pinned magnetization layer, of the storage layer.

However, when the magnetization direction of the storage layer is reversed by spin injection, a spin current flows through the non-magnetic metallic layer such as an electrode layer, and, as a reaction thereto, the magnetization reversal in the storage layer is suppressed; namely, the so-called spin pumping phenomenon takes place.

As a result, the current necessary for reversal of magnetization of the storage layer would be increased, and the spin injection efficiency would be worsened.

Further, in order to reduce the reversing current, it is desirable to reduce as much as possible the element size and saturation magnetization of the storage layer.

However, when the element size and saturation magnetization of the storage layer are reduced, thermal stability of the storage element would be lowered, leading to instable operations of the element.

Thus, there is a need to provide a storage element in which generation of the spin pumping phenomenon can be restrained and which has satisfactory thermal stability, and a memory including the storage elements.

According to the present embodiment, a storage element includes a storage layer configured to hold information by use of a magnetization state of a magnetic material, with a pinned magnetization layer being provided on one side of the storage layer, with a tunnel insulation layer, and with the direction of magnetization of the storage layer being changed through injection of spin polarized electrons by passing a current in the lamination direction, so as to record information in the storage layer, wherein a spin barrier layer configured to restrain diffusion of the spin polarized electrons is provided on the side, opposite to the pinned magnetization layer, of the storage layer; and the spin barrier layer includes at least one material selected from the group including oxides, nitrides, and fluorides.

According to present embodiment, a memory includes storage elements each having a storage layer for holding information by use of a magnetization state of a magnetic material and two kinds of wirings intersecting each other, and the storage elements are configured to be the storage element of the present embodiment. The storage elements are disposed near intersections of the two kinds of wirings and disposed between the two kinds of wirings, and the current in the lamination direction flows in the storage element by way of the two kinds of wirings, whereby the spin polarized electrons are injected.

According to the configuration of the storage element in the present embodiment described above, a storage element includes a storage layer configured to hold information by use of a magnetization state of a magnetic material, with a pinned magnetization layer being provided on one side of the storage layer, with a tunnel insulation layer, and with the direction of magnetization of the storage layer being changed through injection of spin polarized electrons by passing a current in the lamination direction, so as to record information in the storage layer. Accordingly, through injection of spin polarized electrons by passing a current in the lamination direction, so that recording information in the storage layer can be executed.

Also, a spin barrier for restraining diffusion of the spin polarized electrons is provided on the side, opposite to the pinned magnetization layer, of the storage layer, and the spin barrier layer includes at least one material selected from the group including oxides, nitrides, and fluorides. Accordingly, a spin pumping phenomenon can be restrained, thereby reducing current necessary for reversing the magnetization of the storage layers, and the spin injection efficiency can be enhanced.

Furthermore, the spin barrier layer thus provided enhances the thermal stability of the storage layer, thereby enabling to holding information recorded in the storage layer stably.

According to the memory of the present embodiment described above, the memory includes storage elements each having a storage layer for holding information by use of a magnetization state of a magnetic material, and two kinds of wirings intersecting each other, and the storage elements are configured to be the storage element of the present embodiment. The storage elements are disposed near intersections of the two kinds of wirings and disposed between the two kinds of wirings, and the current in the lamination direction flows in the storage element by way of the two kinds of wirings, whereby the spin polarized electrons are injected so as to record information.

Through the spin injection, current (threshold current) necessary for reversing the magnetization direction of the storage layer in the storage elements can be reduced.

Furthermore, information recorded to the storage layer in the storage elements can be hold stably.

According to the above-described present embodiment, by enhancing the spin injection efficiency, current necessary for recording information can be reduced.

Thus, power consumption of the entire memory can be reduced.

As a result, a memory necessary for low power consumption which has not been precedent in the related art can be realized.

In addition, the storage layer in the storage elements has sufficient thermal stability, so that the storage elements have excellent characteristics of holding information.

Furthermore, since current necessary for recording information can be reduced, operation range for recording information by passing a current can be enlarged, thereby securing widely the operation margin.

Therefore, a memory which operates stably with high reliability can be realized.

BRIEF DESCRIPTION OF THE DRAWINGS

FIG. 17 is a perspective diagram schematically showing the configuration of an MRAM according to the related art.

DETAILED DESCRIPTION OF THE PREFERRED EMBODIMENTS

Figure 1:
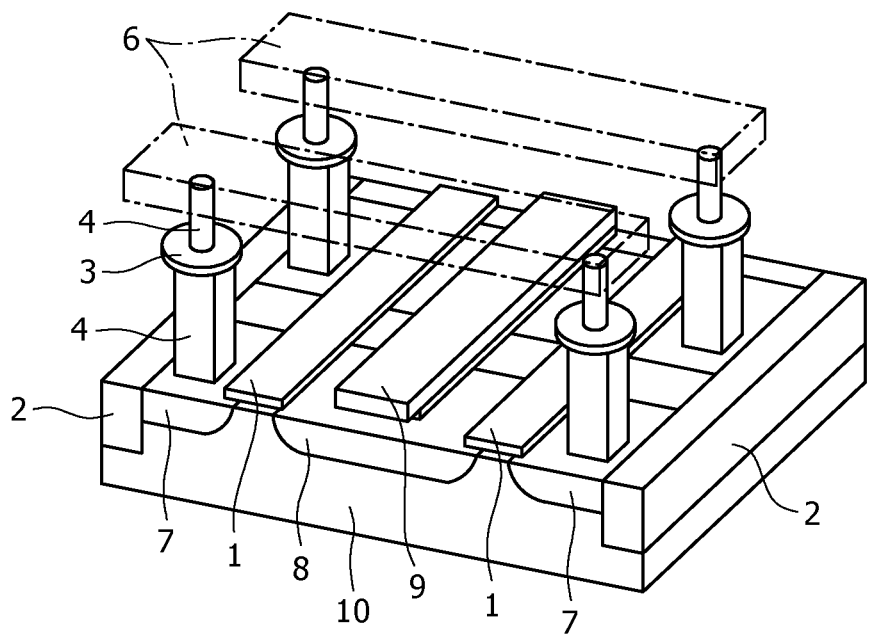
FIG. 1 is a schematic configuration diagram (perspective view) of a memory according to an embodiment of the present invention.

Before describing specific embodiments of the present invention, the gist of the invention will first be described below.

According to the present embodiment, information is recorded through reversal of the magnetization direction of a storage layer in storage elements by the above-mentioned spin injection. The storage layer is composed of a magnetic material such as a ferromagnetic layer, and is operative to hold information by use of the magnetization state (magnetization direction) of the magnetic material.

The basic operation for reversing the magnetization direction of the magnetic layer by spin injection is to pass a current of not less than a threshold (Ic) in the storage element composed of a giant magnetoresistance effect element (GMR element) or a magnetic tunnel junction element (MTJ element) in a direction perpendicular to the film plane of the storage element. In this case, the polarity (direction) of the current depends on the magnetization direction to be reversed.

When a current of which the absolute value is lower than the threshold value is passed, the magnetization reversal does not occur.

Besides, in the present invention, the magnetic tunnel junction (MTJ) element is configured by use of a tunnel insulation layer formed of an insulating material as a non-magnetic intermediate layer between the storage layer and a pinned magnetization layer, taking into account the saturation current of the selection transistor mentioned above.

With the magnetic tunnel junction (MTJ) element configured by use of the tunnel insulation layer, the magnetoresistance variation ratio (MR ratio) can be enhanced and the read signal magnitude can be enlarged, as compared with the case where a giant magnetoresistance effect (GMR) element is configured by use of a non-magnetic conductive layer.

Meanwhile, the threshold Ic of the current needed for reversal of the magnetization direction by spin injection is phenomenalistically represented by the following formula (1) (refer to, for example, F. J. Albert et al., Appl. Phys. Lett., 77, p. 3809, 2000).

$$I_c^{\pm} = k M_s V (H_K^{effective}) / g^{\pm} \qquad (1)$$

where k is a constant, $g^{\pm}$ is a reversal coefficient intrinsic of a material and corresponding to the positive and negative current polarities, $H_K^{effective}$ is an effective magnetic anisotropy, Ms is the saturation magnetization of a magnetic layer, and V is the volume of the magnetic layer.

For securing a wide operation margin of the storage element and permitting the storage element to operate stably, it may be necessary to reduce the threshold Ic of the current.

In addition, it is important to suppress the dispersion of the threshold Ic among the storage elements in memory cells.

With the threshold Ic of the current reduced, the power consumption of each storage element and the power consumption of the memory as a whole can be reduced.

In addition, with the threshold Ic of the current reduced, it becomes possible to use a selection transistor of which the saturation current is smaller, i.e., the gate width is smaller. Therefore, it becomes possible to contrive miniaturization of the memory cell and to enhance the degree of integration of the memory. This promises a reduction in the size of the memory and an increase in the storage capacity of the memory.

In the formula (1) above, the term of the effective magnetic anisotropy $H_K^{effective}$ is composed of $H_K$ in a direction in the film plane of the magnetic layer and $H_K$ in the direction perpendicular to the film plane. In the case of a storage layer using a material having a magnetic anisotropy in the film plane, such as CoFe and CoFeB, $H_K$ in the direction perpendicular to the film plane is greater than $H_K$ in a direction in the film plane, and $H_K$ in the direction perpendicular to the film plane is given as Ms/2.

In this case, the threshold Ic of the formula (1) is represented by the following formula (2):

$$Ic = k \cdot Ms \cdot V \cdot (H_K + Ms/2) / g^{\pm} \qquad (2)$$

where $H_K \ll Ms$.

It is seen from the above formula (2) that, for lowering the threshold Ic of the current, it is effective to reduce the saturation magnetization Ms and the volume V of the storage layer.

Further more, for holding the information recorded in the storage elements, it may be necessary for the thermal stability index (parameter) Δ of the storage layer to be controlled to be not less than a certain value. In general, it is said to be necessary for the thermal stability index Δ to be not less than 60, preferably not less than 70.

The thermal stability index Δ is represented by the following formula:

$$\Delta = Ms \cdot V \cdot H_K (1/2 k_B T) \qquad (3)$$

where $k_B$ is Boltzmann's constant, and T is temperature.

However, as seen from the above formula (3), the thermal stability index Δ would be lowered when the saturation magnetization Ms is lowered.

Therefore, in order to reduce the threshold Ic of the current and to prevent the thermal stability index Δ from being lowered attendant on a lowering in the saturation magnetization, it may be necessary to increase the anisotropic magnetic field $H_K$.

Examples of the measure to increase the anisotropic magnetic field $H_K$ include a method in which the minor axis size of the storage element is reduced to thereby obtain an increased aspect ratio (major axis size/minor axis size) of the storage element, and a method in which the anisotropic magnetic field $H_K$ of the ferromagnetic material constituting the storage layer is increased.

Taking into account an increase in the density of the memory, it is desirable to adopt the latter measure, i.e., the method in which the anisotropic magnetic field $H_K$ of the ferromagnetic material of the storage layer is increased.

For this purpose, it is desirable that the saturation magnetization Ms intrinsic of the ferromagnetic material is maintained throughout the whole film thickness region of the storage layer and the storage layer is a thin film.

Meanwhile, in the case where the storage element is composed of a magnetoresistance effect element such as an MTJ element and a GMR element, as above-mentioned, a non-magnetic metallic layer such as an electrode layer for passing a current in the storage element is generally connected to the side, opposite to the pinned magnetization layer, of the storage layer.

Examples of such a non-magnetic metallic layer include a lower electrode layer, an upper electrode layer, an under metal layer, and the so-called cap layer.

When such a non-magnetic metallic layer is in direct contact with the storage layer, the constituent elements of the non-magnetic metallic layer may diffuse into the ferromagnetic material of the storage layer through interface diffusion, thereby generating a degraded characteristics region where the characteristics intrinsically possessed by the ferromagnetic material of the storage layer are degraded. Particularly, since the lower electrode layer, the upper electrode layer, the under metal layer, the so-called cap layer and the like are thicker than the storage layer (by a factor of about two to several times, in terms of film thickness), the amount of the non-magnetic metallic elements which would diffuse is large.

When the degrade characteristics region is thus generated in the storage layer, the characteristics of the storage layer as a magnetic material are spoiled, resulting in degradation of the MR ratio, the $H_K$ value or the like.

When the MR ratio, the $H_K$ value or the like is thus degraded, reading of the information recorded in the storage element may become difficult to carry out, or the thermal stability index Δ of the storage layer may be lowered, causing the storage element to be thermally instable, which is undesirable for the storage element.

Therefore, it is desirable that the degraded characteristics region due to diffusion between the storage layer and the non-magnetic metallic layer is not generated in the storage layer.

As a result of various investigations, it was found out that when a spin barrier layer for suppressing the diffusion of spin polarized electrons is provided on the side, opposite to the pinned magnetization layer, of the storage layer to thereby isolate the storage layer and the non-magnetic metallic layer from each other by the spin barrier layer, the above-mentioned spin pumping phenomenon can be restrained, the spin injection efficiency can be enhanced, and the generation of the above-mentioned degraded characteristics region can be restrained, resulting in that the storage layer displays the intrinsic characteristics of the ferromagnetic material.

Accordingly, in the present invention, the spin barrier layer for restraining the diffusion of spin polarized electrons is provided on the side, opposite to the pinned magnetization layer, of the storage layer, in configuring the storage element.

Besides, in the present invention, the spin barrier layer is configured by use of at least one material selected from the group including oxides, nitrides, and fluorides.

Specifically, the spin barrier layer is composed of at least one material selected from the group including oxides, nitrides, and fluorides, or is composed of a material which contains at least one material selected from the group including oxides, nitrides, and fluorides as main constituent and which contains a small amount of other element (for example, a metallic element or the like) added thereto.

With the spin barrier layer thus configured by use of at least one material selected from the group including oxides, nitrides, and fluorides, the spin barrier layer has basically insulation property.

To be more specific, examples of the material for the spin barrier layer include magnesium oxide, aluminum oxide and aluminum nitride, in which an element having high affinity to oxygen or nitrogen, such as magnesium and aluminum, is used.

Other than these materials, there may also be used various materials such as $SiO_2$, $Bi_2O_3$, $MgF_2$, $ZnO$, $Ta_2O_5$, $CaF$, $SrTiO_2$, $AlLaO_3$, and Al—N—O.

Incidentally, the spin barrier layer may be formed by use of the same material as that of the intermediate layer (the tunnel insulation layer or the like) between the storage layer and the pinned magnetization layer.

With the spin barrier layer for restraining the diffusion of the spin polarized electrons being thus provided in contact with the side, opposite to the pinned magnetization layer, of the storage layer, the above-mentioned spin pumping phenomenon can be restrained, and the spin injection efficiency can be enhanced.

Further, since the generation of the degraded characteristics region due to diffusion between the storage layer and the non-magnetic metallic layer can be restrained by the spin barrier layer which is basically an insulating layer, the characteristics intrinsically possessed by the ferromagnetic material of the storage layer can be displayed.

This makes it possible to restrain the degradation of the MR ratio due to the degraded characteristics region, thereby improving the read output, and to set a thin storage layer such as to maximize the spin injection efficiency, for example. In other words, it is possible to enhance the spin injection efficiency, without being attended by degradation of characteristics such as MR ratio, and to reduce the threshold Ic of the current.

Besides, since the generation of the degraded characteristics region can be restrained, the thickness of the storage layer can be reduced accordingly.

In addition, with the spin barrier layer provided, the storage layer is sandwiched by the insulation layers (the tunnel insulation layer and the spin barrier layer) on both the upper and lower sides, so that the storage layer is not liable to experience metal-metal atomic diffusion. Therefore, other than the effect of restraining the generation of the degraded characteristics region above-mentioned, it is possible to rigorously control the thickness of the storage to a small thickness, without depending on the conditions of the manufacturing process (thermal hysteresis or the like), the influences of internal stresses, or the surface condition of an underlying layer, and the threshold Ic of the current can thereby be reduced.

Further, in the multiplicity of storage elements formed in a wafer, the dispersion of the threshold Ic of the current can be suppressed.

Besides, particularly when magnesium oxide (MgO) is used as the material for the tunnel insulation layer, the magnetoresistance variation ratio (MR ratio) can be enhanced, as compared with the case of using aluminum oxide, which has been generally used hitherto.

In general, the spin injection efficiency depends on the MR ratio; as the MR ratio is higher, the spin injection efficiency is enhanced, and the magnetization reversing current density can be lowered.

Therefore, by use of magnesium oxide as the material of the tunnel insulation layer present as an intermediate layer, it is possible to reduce the write threshold current in writing information by spin injection, and to write (record) information with less current. In addition, it is possible to enlarge the read signal magnitude.

This makes it possible to secure an MR ratio (TMR ratio), to reduce the write threshold current in writing by spin injection, and to write (record) information with less current. Besides, it is possible to augment the read signal intensity.

In the case where the tunnel insulation layer is composed of a magnesium oxide (MgO) film, it is desirable that the MgO film is crystallized and maintains crystal orientation in the 001 direction.

Where magnesium oxide is used as the material for the tunnel insulation layer, it may be generally demanded that the annealing temperature is not less than 300° C., desirably in a high temperature range of 340 to 380° C., for the purpose of obtaining excellent MR characteristics. Such a temperature is higher than the annealing temperature range (250 to 280° C.) in the case of aluminum oxide used hitherto for forming the intermediate layer.

This is considered to be due to the fact that a high temperature is necessary for forming a magnesium oxide film with appropriate internal structure and crystal structure.

Therefore, excellent MR characteristics may not be obtained unless a heat-resistant ferromagnetic material is used also for the ferromagnetic layer in the storage element so as to secure resistance to high-temperature annealing. According to the present embodiment, the provision of the spin barrier layer restrains diffusion of atoms into the ferromagnetic layer constituting the storage layer, and enhances the thermal resistance of the storage layer, so that the storage layer can endure the annealing at a high temperature of 340 to 400° C., without degradation of magnetic properties.

This is advantageous in that a general semiconductor MOS forming process can be applied at the time of manufacturing a memory including the storage elements, and the memory including the storage elements according to this embodiment can be applied as a general-purpose memory.

In addition, for passing a sufficient write current in the storage element, it may be necessary to reduce the areal resistance of the tunnel insulation layer (tunnel barrier layer).

The areal resistance of the tunnel insulation layer should be controlled to or below several tens of ohms per square micrometers, from the viewpoint of obtaining a current density necessary for reversing the magnetization direction of the storage layer by spin injection.

Then, in the tunnel insulation layer composed of an MgO film, the thickness of the MgO film should be set to or below 1.5 nm, for obtaining an areal resistance in the just-mentioned range.

Examples of the material which can be used for the tunnel insulation layer between the storage layer and the pinned magnetization layer, other than magnesium oxide, include various insulating materials, dielectric materials, and semiconductors, such as aluminum oxide, aluminum nitride, $SiO_2$, $Bi_2O_2$, $MgF_2$, $CaF$, $SrTiO_2$, $AlLaO_2$, Al—N—O, etc.

In addition, it is desirable to reduce the storage element in size so that the magnetization direction of the storage layer can be easily reversed with a small current. Preferably, the area of the storage element is set to or below 0.04 $\mu m^2$.

Ordinarily, the storage layer is formed mainly of a ferromagnetic material such as Co, Fe, Ni, and Gd. The storage layer is formed as a laminate of one or more layers each of which is formed from an alloy of at least two such ferromagnetic materials.

To each ferromagnetic layer, an alloy element or elements are added for the purpose of controlling the magnetic characteristics, such as saturation magnetization, and/or the crystal structure (crystalline, microcrystalline structure, amorphous structure). For example, there may be used a material which contains a CoFe alloy, a CoFeB alloy, an Fe alloy or an NiFe alloy as a main constituent and which contains added thereto at least one element selected from the group including magnetic elements, such as Gd, and other (non-magnetic) elements such as B, C, N, Si, P, Al, Ta, Mo, Cr, Nb, Cu, Zr, W, V, Hf, Gd, Mn, and Pd. Besides, amorphous materials obtained by adding at least one element selected from the group including Zr, Hf, Nb, Ta and Ti to Co, Heusler materials such as CoMnSi, CoMnAl, CoCrFeAl, etc. may also be used.

Incidentally, where a CoFeB alloy is used for the ferromagnetic layer constituting the storage layer, the total content of Co and Fe as ferromagnetic elements in the storage layer is preferably not less than 60 atom %, from the viewpoint of securing a magnetization and soft magnetic properties.

When the total content of Co and Fe is less than 60 atom %, a saturation magnetization as a ferromagnetic layer and the coercive force may not be obtained. Besides, in general, where the CoFe has a Co:Fe ratio in the range of from 90:10 to 40:60, good soft magnetic properties with magnetic anisotropy dispersion suppressed appropriately can be displayed.

In addition, the storage layer can also be configured by direct lamination of a plurality of ferromagnetic layers differing in material and/or in composition range. Besides, ferromagnetic and soft magnetic layers may be laminated, or a plurality of ferromagnetic layers may be laminated, with a soft magnetic layer interposed between the adjacent ferromagnetic layers. Even in the cases of such laminations, the effects of the present invention can be obtained.

Furthermore, in the present invention, when two or more ferromagnetic layers are laminated, with a non-magnetic layer interposed between the adjacent ferromagnetic layers, the saturation magnetization Ms of the storage layer can be reduced, whereby the threshold Ic of the current can be lowered.

Besides, in such a configuration, the magnitude of interaction between the ferromagnetic layers can be regulated, which is effective in that the magnetization reversing current can be controlled to a low level even when the size of the storage element is reduced to or below the sub-micrometer order.

Preferable examples of the material for the non-magnetic layer include Ti, Ta, Nb, and Cr, and these elements can be used in the elemental state or as alloys thereof.

Incidentally, any other non-magnetic elements may be used inasmuch as the same effect as above-mentioned can be obtained. Examples of the other non-magnetic elements include Ru, Os, Re, Ir, Au, Ag, Cu, Al, Bi, Si, B, C, Pd, Pt, Zr, Hf, W, and Mo.

In addition, desirably, the non-magnetic layer is formed by use of a non-magnetic material not liable to diffuse into the ferromagnetic material of the storage layer, or is formed in a sufficiently small film thickness as compared with the above-mentioned electrode layer, under layer, cap layer and the like so that the above-mentioned degraded characteristics region would not be generated widely in the storage layer.

For example, in the case where the ferromagnetic layer of the storage layer contains CoFeB as a main constituent and at least one non-magnetic element selected from the group including Ti, Ta, Nb and Cr is used for the non-magnetic layer, the film thickness of the non-magnetic layer is preferably so set that the content of the non-magnetic element based on the whole of the storage layer is in the range of 1 to 20 atom %.

If the content is too low (the non-magnetic layer is too thin), the effect of lowering the saturation magnetization is reduced, and it is difficult to form the ferromagnetic layer in a good state on the non-magnetic layer.

On the other hand, if the content is too high (the non-magnetic layer is too thick), the saturation magnetization may be low, but the MR ratio of the storage element is also low, so that reading of information is difficult to achieve. Besides, the degraded characteristics region is liable to be generated during manufacturing.

Incidentally, in place of the configuration in which two or more ferromagnetic layers are laminated, with the non-magnetic layer interposed between the adjacent ferromagnetic layers, there may also be adopted a configuration in which a non-magnetic element or elements are contained in the ferromagnetic material of the storage layer. In the latter case, also, the saturation magnetization Ms of the storage layer can be lowered, whereby the threshold Ic of the current can be reduced.

The storage layer with such a configuration can be formed, for example, by use of a target containing both the ferromagnetic material and the non-magnetic element, or by mixing the non-magnetic element into the ferromagnetic material by co-sputtering.

In this case, the content of the non-magnetic element is set equally to the case of laminating to ferromagnetic layers.

Where the non-magnetic element is contained in the ferromagnetic material of the storage layer, the non-magnetic element are distributed also in the vicinity of the interface between the tunnel insulation layer and the storage layer, which causes a lowering in the MR ratio.

Specifically, from the viewpoint of MR ratio, the laminate structure of the ferromagnetic and non-magnetic layers is advantageous, when compared for the same content of the non-magnetic element.

Furthermore, in the present invention, a non-magnetic metallic element is contained in the spin barrier layer composed of the above-mentioned insulating material (oxide, nitride, or fluoride), whereby the resistance of the spin barrier layer is lowered, and the increase in the resistance of the storage element due to the presence of the spin barrier layer can be suppressed.

The spin barrier layer configured in this manner can be formed, for example, by laminating the layer formed from at least one material selected from the group including oxides, nitrides, and fluorides (high-resistance layer) with the non-magnetic metallic layer, and then heat treating the laminate so as to diffuse the non-magnetic metallic element into the high-resistance layer.

Examples of the non-magnetic metallic element to be contained in the spin barrier layer include transition metal elements such as Ti, Ta, Zr, Hf, Nb, Cr, Mo, W, V, Cu, etc. and noble metals such as Au, Pd, Pt, etc.

In the case of the transition metal element such as Ti, Ta, Zr, etc., a high-concentration oxygen solid solution or nitrogen solid solution is formed upon contact with the insulation layer, and mixing with the insulation layer progresses, with the result of a change from an insulating state to a conductive state, whereby an incomplete insulation layer is formed, and the resistance is lowered.

On the other hand, in the case of the noble metal such as Au, Pt, etc., the insulation layer and the metallic layer remain in the state of being separated into two phases, so that a condition where the insulating material is present discretely in the metallic phase or a holed insulation layer is obtained, whereby the rise in resistance is suppressed. The thickness of such a metallic layer may be set to be equal to or greater than the thickness of the insulation layer, without any problem.

The upper limit of the thickness of the non-magnetic metallic layer is not particularly present but may appear on the basis of the manufacturing process; it is considered that a thickness of about 5 nm is sufficient.

Besides, in place of the forming method in which the insulation layer and the metallic layer are laminated and the non-magnetic metallic element are diffused by a heat treatment, there may be used a method in which an incomplete insulation layer containing the insulating material and the non-magnetic metallic material in mixture from the start is formed.

In this case, the spin barrier layer is formed by use of a material in which the material of the insulation layer and the material of the metallic layer are mixed.

As for the film thickness of the spin barrier layer in this case, a thickness of about 5 nm is considered to be sufficient.

Where the resistance of the spin barrier layer is very high, the resistance of the storage element is also very high, so that a high voltage is necessary in recording or reading information into or from the storage element. Besides, the variation in the resistance by the tunnel magnetoresistance effect of the MTJ element is small relative to the resistance of the storage element, so that the MR ratio is degraded, making it difficult to read the recorded information.

On the other hand, where the spin barrier layer is configured to contain the non-magnetic metallic element, the increase in the resistance of the storage element due to the presence of the spin barrier layer can be suppressed; therefore, a surplus voltage is not necessary in recording or reading information into or from the storage element, and the MR ratio is not degraded.

In addition, since the increase in the resistance of the storage element due to the presence of the spin barrier layer is suppressed, the film thickness of the spin barrier layer may be set to be comparable to or greater than of the tunnel insulation layer, without any problem.

Taking into account the MR ratio and the characteristics of the storage element, the content of the non-magnetic metallic element is preferably so set that the areal resistance of the spin barrier layer will be not more than 10 $\Omega\mu m^2$.

Meanwhile, depending on the combination of the ferromagnetic material of the storage layer with the insulating material of the spin barrier layer, the magnetic properties of the storage layer may be changed due the diffusion or mixing of the oxygen atoms or the like contained in the spin barrier layer into the storage layer.

Taking this into consideration, in the present invention, a non-magnetic metallic layer is further provided between the storage layer and the spin barrier layer, whereby it is possible to control the variations in the magnetic properties due to the diffusion or mixing of the oxygen atoms or the like contained in the spin barrier layer into the storage layer.

As the material for the non-magnetic metallic layer provided between the storage layer and the spin barrier layer, there may be used a non-magnetic metal which itself has a small spin pumping effect, for example, Cu, Ta or the like. These elements are not limitative, and there may also be used such elements as Al, Si, Ti, Zn, Zr, Nb, Mo, Hf, W, and Ru.

Desirably, this non-magnetic metallic layer is formed by use of a non-magnetic material not liable to diffuse into the ferromagnetic material of the storage layer, or is formed in a sufficiently small film thickness as compared with the above-mentioned electrode layer, under layer, cap layer and the like so that the above-mentioned degraded characteristics region would not be generated widely in the storage layer.

The configuration in which the non-magnetic metallic layer is thus provided between the storage layer and the spin barrier layer is applicable to the case where the storage layer is on the upper side of the spin barrier layer and to the case where the spin barrier layer is on the upper side of the storage layer; however, the effect of the configuration is considered to be greater particularly where the spin barrier layer is on the upper side, since the spin barrier layer is formed after the storage layer.

In the storage element in the present invention, desirably, the pinned magnetization layer has a unidirectional anisotropy, and the storage layer has a uniaxial anisotropy.

In addition, the film thicknesses of the pinned magnetization layer and the storage layer are desirably in the range of 1 to 40 nm and in the range of 1 to 10 nm, respectively.

The other configurations of the storage element may be the same as the configurations, known in the past, of a storage element for recording information by spin injection.

The pinned magnetization layer has its magnetization direction fixed by being composed of a ferromagnetic layer or by utilizing antiferromagnetic coupling between an antiferromagnetic layer and a ferromagnetic layer.

In addition, the pinned magnetization layer is composed of a single ferromagnetic layer, or has a laminate ferri structure in which a plurality of ferromagnetic layer are laminated, with a non-magnetic layer between the adjacent ferromagnetic layers. Where the pinned magnetization layer has the laminate ferri structure, the sensitivity of the pinned magnetization layer to external magnetic fields can be lowered, so that it is possible to suppress unnecessary variations in the magnetization of the pinned magnetization layer due to external magnetic fields, and to make the storage element operate stably. Furthermore, it is possible to regulate the film thickness of each of the ferromagnetic layers, and to suppress leakage of magnetic field from the pinned magnetization layer.

Examples of the material usable for the ferromagnetic layers constituting the pinned magnetization layer in the laminate ferri structure include Co, CoFe, and CoFeB. Examples of the material usable for the non-magnetic layer include Ru, Re, Ir, and Os.

Examples of the material for the antiferromagnetic layer include such magnetic materials as FeMn alloy, PtMn alloy, PtCrMn alloy, NiMn alloy, IrMn alloy, and NiO, $Fe_2O_3$.

Besides, it is possible, by adding a non-magnetic element such as Ag, Cu, Au, Al, Si, Bi, Ta, B, C, O, N, Pd, Pt, Zr, Hf, Ir, W, Mo, Nb, etc. to the magnetic material, to control magnetic properties and other properties such as crystal structure, crystallinity, substance stability, etc.

In addition, as the film configuration of the storage element, a configuration in which the storage layer is disposed on the upper side of the pinned magnetization layer and a configuration in which the storage layer is disposed on the lower side of the pinned magnetization layer can be used without any problem.

Incidentally, as for the method of reading the information recorded in the storage layer of the storage element, a magnetic layer serving as a reference for information may be provided on one side of the storage layer of the storage element, with a thin insulation layer therebetween, and the information may be read by use of a ferromagnetic tunnel current flowing through the insulation layer or may be read by use of the magnetoresistance effect.

Now, specific embodiments of the present invention will be described below.

As an embodiment of the present invention, a schematic configuration diagram (perspective view) of a memory is shown in FIG. 1.

The memory includes storage elements capable of holding information in terms of magnetization state, the storage elements being disposed near intersections between two kinds of address wirings (e.g., word lines and bit lines) intersecting orthogonally.

Specifically, a drain region 8, a source region 7, and a gate electrode 1 which constitute a selection transistor for selecting each memory cell are formed at a portion, isolated by an element isolation layer 2, of a semiconductor substrate 10 such as a silicon substrate. Of these component, the gate electrode 1 functions also as one address wiring (e.g., word line) extending in the front-rear direction in the figure.

The drain region 8 is formed in common for selection transistors arranged on the left and right sides in the figure, and a wiring 9 is connected to the drain region 8.

A storage element 3 is disposed between the source region 7 and the other address wiring (e.g., bit line) 6 disposed on the upper side and extending in the left-right direction in the figure. The storage element 3 has a storage layer composed of a ferromagnetic layer of which the magnetization direction can be reversed by spin injection.

In addition, the storage element 3 is disposed near the intersection between the two kinds of wirings 1 and 6.

The storage element 3 is connected to the bit line 6 and the source region 7 through upper and lower contact layers 4, respectively.

This ensures that the magnetization direction of the storage layer can be reversed through spin injection by passing a current in the vertical direction in the storage element 3 by way of the two kinds of wirings 1 and 6.

Figure 2:
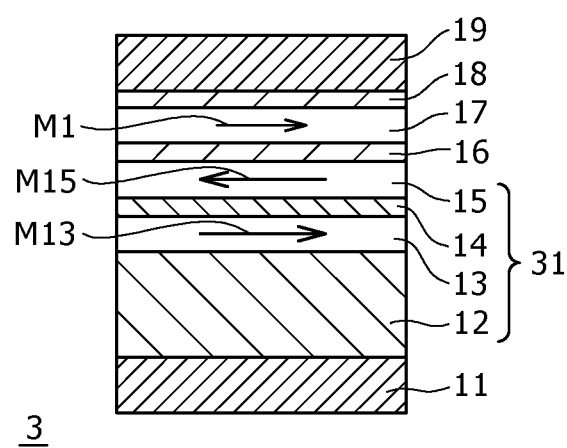
FIG. 2 is a sectional diagram of a storage element in FIG. 1.

Besides, a sectional view of the storage element 3 in the memory according to the present embodiment is shown in FIG. 2.

As shown in FIG. 2, the storage element 3 has a pinned magnetization layer 31 provided beneath a storage layer 17 of which the direction of magnetization M1 can be changed by spin injection.

An insulation layer 16 serving as a tunnel barrier layer (tunnel insulation layer) is provided between the storage layer 17 and the pinned magnetization layer 31, and the storage layer 17 and the pinned magnetization layer 31 constitute an MTJ element.

In addition, an under layer 11 is formed beneath the pinned magnetization layer 31, and a cap layer 19 is formed as an uppermost layer.

Furthermore, the pinned magnetization layer 31 has an exchange bias laminate ferri structure.

Specifically, two ferromagnetic layers 13 and 15 are laminated, with a non-magnetic layer 14 therebetween, to be in antiferromagnetic coupling, and an antiferromagnetic layer 12 is disposed beneath the ferromagnetic layer 13, whereby the pinned magnetization layer 31 is configured. The ferromagnetic layer 13 has its direction of magnetization M13 fixed by the antiferromagnetic layer 12.

Since the two ferromagnetic layers 13 and 15 are in antiferromagnetic coupling, the magnetization M13 of the ferromagnetic layer 13 is rightward, while the magnetization M15 of the ferromagnetic layer 15 is leftward; thus, these magnetization directions are opposite to each other.

This ensures that the magnetic fluxes leaking from the ferromagnetic layers 13 and 15 in the pinned magnetization layer 31 cancel each other.

The material of the storage layer 17 is not particularly limited, and alloy materials including one or more of iron, nickel and cobalt can be used. Further, the material of the storage layer 17 may contain a transition metal element such as Nb, Zr, Gd, Ta, Ti, Mo, Mn, Cu, etc., and/or a light element such as Si, B, C, etc. Further, the storage layer 17 may be configured by direct lamination of a plurality of films formed of different materials (without any non-magnetic layer interposed); for example, a laminate film of CoFe/NiFe/CoFe may be used.

The materials of the ferromagnetic layers 13 and 15 in the pinned magnetization layer 31 are not particularly limited, and alloy materials including one or more of iron, nickel and cobalt can be used. Further, the materials may contain a transition metal element such as Nb, Zr, Gd, Ta, Ti, Mo, Mn, Cu, etc., and/or a light element such as Si, B, C, etc. In addition, the ferromagnetic layers 13 and 15 may be configured by direct lamination of a plurality of films formed of different materials (without any non-magnetic layer interposed); for example, a laminate film of CoFe/NiFe/CoFe may be used.

Examples of the material usable for the non-magnetic layer 14 constituting the laminate ferri structure of the pinned magnetization layer 31 include ruthenium, copper, chromium, gold, and silver.

The film thickness of the non-magnetic layer 14 varies depending on the material thereof, and is preferably in the range of about 0.5 to 2.5 nm.

The film thicknesses of the ferromagnetic layers 13 and 15 in the pinned magnetization layer 31 and of the storage layer 17 may be regulated as occasion demands, and are appropriately in the range of 1 to 5 nm.

In this embodiment, particularly, a spin barrier layer 18 for restraining the diffusion of spin polarized electrons is provided on the side, opposite to the pinned magnetization layer 31, of the storage layer 17 in the storage element 3, namely, on the upper side of the storage layer 17. The spin barrier layer 18 is disposed between the storage layer 17 and the cap layer 19, and is in contact with the storage layer 17.

Furthermore, the spin barrier layer 18 is composed of at least one material selected from the group including oxides, nitrides, and fluorides.

Specifically, the spin barrier layer 18 is configured by use of at least one material selected from the group including oxides, nitrides, and fluorides, or by use of a material which contains at least one material selected from the group including oxides, nitrides, and fluorides as a main constituent and which contains a small amount of other element (e.g., metallic element) added thereto.

With such a spin barrier layer 18 provided, the diffusion of spin polarized electrons is restrained, and the diffusion of metallic element from the cap layer 19 into the storage layer 17 is restrained.

Furthermore, in the present embodiment, where the insulation layer 16 as an intermediate layer is a magnesium oxide layer, the magnetoresistance variation ratio (MR ratio) can be enhanced.

By such enhancement of the MR ratio, also, it is possible to enhance the spin injection efficiency and thereby to reduce the current density necessary for reversing the direction of magnetization M1 of the storage layer 17.

The storage element 3 in this embodiment can be manufactured by continuously forming the layers ranging from the under layer 11 to the cap layer 19 in a vacuum apparatus and thereafter forming the pattern of the storage element 3 by such processing as etching.

According to this embodiment as above-described, the spin barrier layer 18 composed of at least one material selected from the group including oxides, nitrides, and fluorides is provided on the side, opposite to the pinned magnetization layer 31, of the storage layer 17, so that the diffusion of spin polarized electrons is restrained by the spin barrier layer 18. This ensures that spin accumulation occurs in the storage layer 17, and the spin pumping phenomenon at the time of reversing the direction of magnetization M1 of the storage layer 17 is restrained.

Therefore, it is possible to prevent the spin injection efficiency from being worsened due to the spin pumping phenomenon, and thereby to enhance the spin injection efficiency.

In addition, since the spin barrier layer 18 restrains the diffusion of metallic element from the cap layer 19 into the storage layer 17 and permits the ferromagnetic material of the storage layer 17 to display its intrinsic characteristics, it is possible to enhance the thermal stability index Δ of the storage layer 17. This enhances also the thermal stability of the storage layer 17.

With the thermal stability of the storage layer 17 thus enhanced, the operation range in recording information by passing a current in the storage element 3 can be enlarged, so that it is possible to secure a wide operation margin and to permit the storage element 3 to operate stably.

Therefore, a memory capable of operating stably and being high in reliability can be realized.

In addition, since the spin injection efficiency can be enhanced, the current necessary for reversing the direction of magnetization M1 of the storage layer 17 by spin injection can be reduced.

Therefore, the power consumption of the memory including the storage elements 3 can be reduced.

Besides, the memory which includes the storage elements 3 shown in FIG. 2 and which is configured as shown in FIG. 1 is advantageous in that a general semiconductor MOS forming process can be applied in manufacturing the memory.

Therefore, the memory in this embodiment can be applicable as a general-purpose memory.

Particularly, the storage element 3 shown in FIG. 2 is enhanced in thermal resistance of the storage layer 17 by the spin barrier layer 18, so that the magnetic properties of the storage layer 17 would not be degraded even upon annealing at 340 to 400° C., and the general semiconductor MOS forming process can be readily applied.

Figure 3:
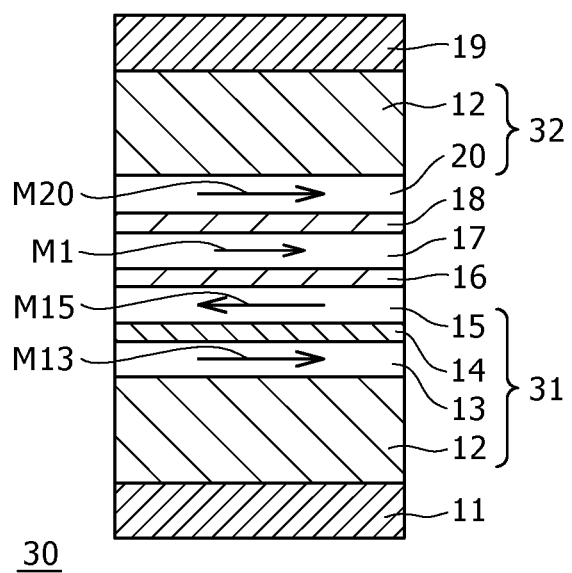
FIG. 3 is a schematic configuration diagram of a storage element according to another embodiment of the present invention.

Now, as another embodiment of the present invention, a schematic configuration diagram (sectional view) of a storage element is shown in FIG. 3.

The storage element 30 in this embodiment has a configuration in which a pinned magnetization layer 31 is provided on the lower side of a storage layer 17 of which the direction of magnetization M1 is changed by spin injection, and a pinned magnetization layer 32 is provided on the upper side of the storage layer 17. Specifically, the upper and lower two pinned magnetization layers 31 and 32 are provided for the storage layer 17.

The upper pinned magnetization layer 32 has only a single ferromagnetic layer 20 and an antiferromagnetic layer 12 thereon.

The direction of magnetization M20 of the ferromagnetic layer 20 in the pinned magnetization layer 32 is fixed by the antiferromagnetic layer 12.

In addition, a cap layer 19 is formed on the antiferromagnetic layer 12 in the upper pinned magnetization layer 32.

In this embodiment, particularly, a spin barrier layer 18 for restraining the diffusion of spin polarized electrons is provided on the side, opposite to the lower pinned magnetization layer 31 and a tunnel insulation layer 16, of the storage layer 17 of the storage element 30, i.e., on the upper side of the storage layer 17.

Further, the spin barrier layer 18 is configured by use of at least one material selected from the group including oxides, nitrides, and fluorides.

The spin barrier layer 18 is disposed between the storage layer 17 and the ferromagnetic layer 20 in the upper pinned magnetization layer 32, and is in contact with the storage layer 17.

Therefore, the storage layer 17, the spin barrier layer 18 and the upper pinned magnetization layer 32 constitute an MTJ element. Specifically, in this MTJ element, the spin barrier layer 18 functions also as an intermediate layer between the storage layer 17 and the pinned magnetization layer 32.

The other configurations are the same as those of the storage element 3 shown in FIG. 2 above, and, therefore, they are denoted by the same symbols as used above, and descriptions of them are omitted.

In addition, a memory configured in the same manner as the memory shown in FIG. 1 can be configured by use of the storage elements 30 according to this embodiment.

Specifically, the storage elements 30 are disposed near intersections between two kinds of address wirings to compose a memory, and currents in the vertical direction (lamination direction) are passed in some of the storage elements 30 by way of the two kinds of wirings, so as to reverse the direction of magnetization M1 of the storage layer 17 in the storage elements 30 by spin injection, whereby information can be recorded in the storage elements 30.

This provides the advantage that a general semiconductor MOS forming process can be applied in manufacturing the memory including the storage elements 30, and ensures that the memory including the storage elements 30 according to this embodiment can be applied as a general-purpose memory.

Furthermore, in this embodiment, where the tunnel insulation layer 16 as an intermediate layer is composed of a magnesium oxide layer, the magnetoresistance variation ratio (MR ratio) can be enhanced.

With such enhancement of MR ratio, also, the spin injection efficiency can be enhanced, and the current density necessary for reversing the direction of magnetization M1 of the storage layer 17 can be reduced.

According to the present embodiment as above-described, the spin barrier layer 18 composed of at least one material selected from the group including oxides, nitrides, and fluorides is provided on the side, opposite to the lower pinned magnetization layer 31 and the tunnel insulation layer 16, of the storage layer 17. Therefore, like in the preceding embodiment, the spin pumping phenomenon at the time of reversing the direction of magnetization M1 of the storage layer 17 is restrained, and the spin injection efficiency can be enhanced.

In addition, since the thermal stability of the storage layer 17 is enhanced, in the same manner as in the preceding embodiment, it is possible to secure a wide operation margin and to permit the storage element 3 to operate stably.

Furthermore, in this embodiment, the pinned magnetization layers 31 and 32 are provided for the storage layer 17, with the tunnel insulation layer 16 and the pin barrier layer 18 interposed therebetween on the lower side and the upper side.

By the effect of this configuration also, therefore, it is possible to reduce the current necessary for reversing the direction of magnetization M1 of the storage layer 17.

Accordingly, it is possible to realize a memory which operates stably and is high in reliability, and to reduce the power consumption of the memory including the storage elements 30.

Figure 4:
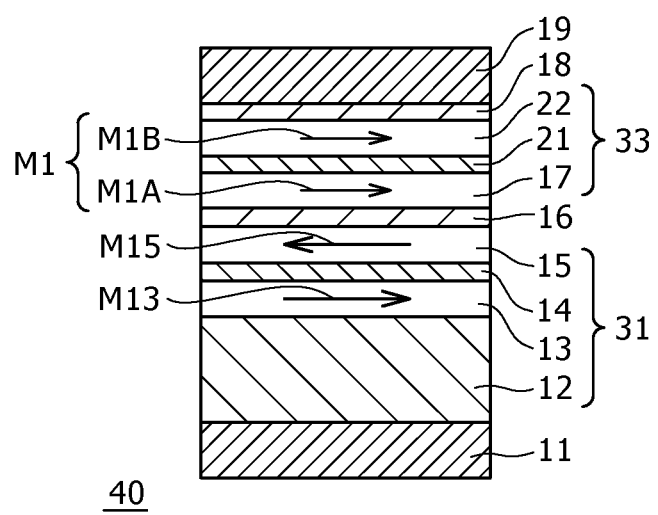
FIG. 4 is a schematic configuration diagram of a storage element according to a further embodiment of the present invention.

Now, as a further embodiment of the present invention, a schematic configuration diagram (sectional view) of a storage element is shown in FIG. 4.

The storage element 40 in this embodiment is particularly characterized in that two ferromagnetic layers 17 and 22 are laminated, with a non-magnetic layer 21 therebetween, to constitute a storage layer 33.

In this case, the effective content of non-magnetic element in the storage layer 33 is determined according to the film thickness of the non-magnetic layer 21.

In addition, in the two ferromagnetic layers 17 and 22 in the storage layer 33, the magnetization M1A of the ferromagnetic layer 17 and the magnetization M1B of the ferromagnetic layer 22 are in the same direction (parallel directions), and the sum total of the magnetizations M1A and M1B of the two layers constitutes the magnetization M1 of the storage layer 33.

As the material of the ferromagnetic layers 17 and 22 in the storage layer 33, for example, CoFeB may be used.

Besides, as the material for the non-magnetic layer 21 in the storage layer 33, preferably, there is used a non-magnetic metallic material composed of at least one selected from the group including Ti, Ta, Nb, and Cr.

The non-magnetic layer 21 in the storage layer 33 is desirably so configured that the above-mentioned degraded characteristics region will not be widely formed in the storage layer 33, by using a non-magnetic material not liable to diffuse into the ferromagnetic material of the storage layer 33, or by setting the film thickness of the non-magnetic layer 21 to be sufficiently small, as compared with the above-mentioned electrode layer, under layer, cap layer 19, etc.

For example, in the case where the ferromagnetic layers 17 and 22 in the storage layer 33 contain CoFeB as a main constituent and where at least one non-magnetic element selected from the group including Ti, Ta, Nb, and Cr is used for forming the non-magnetic layer 21, the film thickness of the non-magnetic layer 21 is so set that the content of the non-magnetic element based on the whole part of the storage layer 33 is in the range of 1 to 20 atom %.

The other configurations of the storage element 40 are the same as those of the storage element 3 in the preceding embodiment shown in FIG. 2, so that they are denoted by the same symbols as used above and descriptions of them are omitted.

The film thicknesses of the ferromagnetic layers 13, 15, 17 and 22 in the pinned magnetization layer 31 and the storage layer 33 are appropriately in the range of 1 to 5 nm.

The storage element 40 in the present embodiment can be manufactured by continuously forming the layers ranging from the under layer 11 to the cap layer 19 in a vacuum apparatus and thereafter forming the pattern of the storage element 40 by such processing as etching.

In addition, a memory configured in the same way as the memory shown in FIG. 1 can be configured by use of the storage elements 40 according to this embodiment.

Specifically, the storage elements 40 are arranged near intersections between two kinds of address wirings to compose a memory, and currents in the vertical direction (lamination direction) are passed in some of the storage elements 40 by way of the two kinds of wirings, so as to reverse the direction of the magnetization M1 (M1A, M1B) of the storage layer 33 by spin injection, whereby information can be recorded in the storage elements 40.

This is advantageous in that a general semiconductor MOS forming process can be applied in manufacturing the memory including the storage elements 40, and the memory including the storage elements 40 in this embodiment can be applied as a general-purpose memory.

According to this embodiment as above, the spin barrier layer 18 is provided on the side, opposite to the pinned magnetization layer 31, of the storage layer 33, so that the spin pumping phenomenon at the time of reversing the direction of magnetization M1 (M1A, M1B) of the storage layer 33 is restrained, in the same manner as in the storage element 3 in the preceding embodiment shown in FIG. 2, whereby the spin injection efficiency can be enhanced.

Besides, since the thermal stability of the storage layer 33 can be enhanced, in the same manner as in the preceding embodiment, it is possible to secure a wide operation margin and to permit the storage element 40 to operate stably.

Further, according to the present embodiment, the storage layer 33 has the two ferromagnetic layers 17 and 22 laminated, with the non-magnetic layer 21 therebetween, so that the saturation magnetization Ms of the storage layer 33 can be lowered, which also contributes to the reduction in the threshold Ic of the current.

In addition, since the magnitude of the interaction between the ferromagnetic layers 17 and 22 can be regulated, the current threshold Ic can be effectively restrained from being increased even when the size of the storage element 40 is reduced down to or below the sub-micrometer order.

Therefore, it is possible to realize a memory which operates stably and is high in reliability, and to reduce the power consumption of the memory including the storage elements 40.

Incidentally, in the storage element 40 according to this embodiment as above-described, there may be the case, depending on the relationship between the film thickness of the ferromagnetic layers 17 and 22 and the film thickness of the non-magnetic layer 21, where the magnetization M1A of the ferromagnetic layer 17 and the magnetization M1B of the ferromagnetic layer 22 are in the opposite directions (antiparallel directions) and the two ferromagnetic layers 17 and 22 are in exchange coupling.

Even in such a case, the effects of respective provision of the spin barrier layer 18 and the non-magnetic layer 21 can be obtained in the same manner as above.

Besides, while Ti, Ta, Nb, and Cr have been given as candidates for the non-magnetic element constituting the non-magnetic layer 21 in this embodiment as above-described, any other non-magnetic elements may also be adopted inasmuch as the same effect as above-mentioned can be obtained.

Furthermore, in place of the configuration in which two or more ferromagnetic layers 17, 22 are laminated, with the non-magnetic layer 21 interposed between the adjacent ferromagnetic layers, as in this embodiment, there may be adopted a configuration in which a non-magnetic element or elements are contained in the ferromagnetic material constituting the storage layer. In the same manner as above, this configuration also makes it possible to lower the saturation magnetization Ms of the storage layer, whereby the threshold Ic of the current can be reduced.

In this case, also, the content of the non-magnetic element can be set in the same manner as in the case of lamination of layers.

Now, as yet another embodiment of the present invention, the schematic configuration of a storage element will be described below.

According to the present embodiment, in the storage element 3 with the configuration as shown in FIG. 2, a non-magnetic metallic element or elements are further contained in the material which constitutes the spin barrier layer 18 and which is selected from the group including oxides, nitrides, and fluorides.

This configuration makes it possible to reduce the resistance of the spin barrier layer 18, as compared with the case where the spin barrier layer 18 is composed only of at least one material selected from the group including oxides, nitrides, and fluorides.

Examples of the non-magnetic metallic element to be contained in the spin barrier layer 18 include transition metal elements and noble metals, such as Ti, Ta, Zr, Hf, Nb, Cr, Mo, W, V, Cu, Au, Pd, and Pt.

The spin barrier layer 18 thus containing the non-magnetic metallic element can be formed, for example, as follows.

Figure 5:
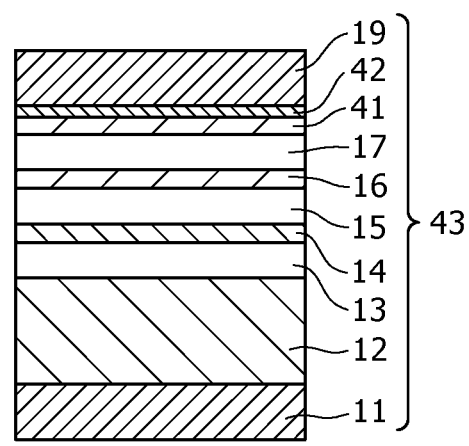
FIG. 5 is a sectional diagram of a laminate film to be a storage element, in yet another embodiment of the present invention.

As shown in a sectional view of a laminate film to be a storage element 3 in FIG. 5, a high-resistance layer 41 composed of an insulating material selected from the group including oxides, nitrides, and fluorides and a non-magnetic metallic layer 42 are laminated on each other, to form a laminate film 43 which will be the storage element 3.

Thereafter, the non-magnetic metallic element are diffused from the non-magnetic metallic layer 42 into the high-resistance layer 41, whereby a spin barrier layer 18 can be formed which has been lowered in resistance by the non-magnetic metallic element and has become an incomplete insulation layer.

Preferably, the spin barrier layer 18 containing the non-magnetic metallic element is so controlled to have an areal resistance of not more than 10 $\Omega\mu m^2$.

Since the resistance of the spin barrier layer 18 is reduced by the non-magnetic metallic element, even in the case where, for example, the same insulating material as for the tunnel insulation layer 16 is used for the spin barrier layer 18 and where the spin barrier layer 18 has the same film thickness as that of the tunnel insulation layer 16, the spin barrier layer 18 can be made to have a sufficiently low resistance, as compared with the tunnel insulation layer 16.

This ensures that, notwithstanding the presence of the spin barrier layer 18, the variation in the resistance of the storage element 3 by the magnetoresistance effect in the MTJ element having the tunnel insulation layer 16 can be detected without any problem, and, therefore, the information recorded in the storage element 3 can be read.

Incidentally, the non-magnetic metallic layer 42 for diffusing the non-magnetic metallic element may be completely lost or may be partly left, upon the diffusion of the non-magnetic metallic element into the high-resistance layer 41 by a heat treatment.

In the case where the non-magnetic metallic layer 42 is partly left even after the heat treatment, a configuration in which the non-magnetic metallic layer 42 is present between the spin barrier layer 18 and the cap layer 19, in contrast to the configuration of the storage element 3 shown in FIG. 2.

In this case, since the material constituting the non-magnetic metallic layer 42 is the same as or similar to the material of the cap layer 19 generally composed of a non-magnetic metal, the non-magnetic metallic layer 42 can be regarded as part of the cap layer 19.

Besides, if the non-magnetic metallic element of the non-magnetic metallic layer 42 is diffused into the storage layer 17 on the lower side of the spin barrier layer 18, the above-mentioned degraded characteristics region might be formed.

Therefore, it is desirable to control the conditions of the heat treatment and the like in such a manner that the diffusion of the non-magnetic metallic element into the storage layer 17 is restrained as securely as possible. Besides, in the case of forming the laminate film 43 shown in FIG. 5, for example, the film thickness of the non-magnetic metallic layer 42 is reduced to or below a certain level.

According to this embodiment as above-described, like in the preceding embodiments shown in FIG. 2, the spin pumping phenomenon at the time of reversal of the direction of magnetization M1 of the storage layer 17 is restrained by the spin barrier layer 18, whereby the spin injection efficiency can be enhanced.

Besides, since the thermal stability of the storage layer 17 can be enhanced, like in the previous embodiments, it is possible to secure a wide operation margin and to permit the storage element 3 to operate stably.

Furthermore, since the spin barrier layer 18 contains the non-magnetic metallic element, the resistance of the spin barrier layer 18 can be lowered. Therefore, the overall resistance of the storage layer 3 can be restrained from being raised too much due to the presence of the spin barrier layer 18.

This ensures that, at the time of recording or reading information into or from the storage element 3, a surplus voltage is not necessary and the MR ratio is not degraded.

Therefore, it is possible to realize a memory which operates stably and is high in reliability, and to reduce the power consumption of the memory including the storage elements 3.

Figure 6:
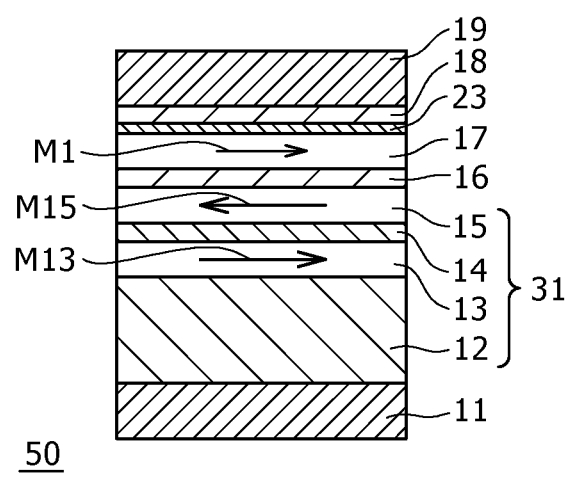
FIG. 6 is a schematic configuration diagram of a storage element according to a yet further embodiment of the present invention.

Now, as a yet further embodiment of the present invention, a schematic configuration diagram of a storage element is shown in FIG. 6.

The storage element 50 in this embodiment has particularly a laminate configuration in which a spin barrier layer 18 is not provided in direct contact with a storage layer 17 but is provided on one side of the storage layer 17, with a non-magnetic metallic layer 23 interposed therebetween.

With the non-magnetic metallic layer 23 thus provided between the storage layer 17 and the spin barrier layer 18, variations in the magnetic properties of the storage layer 17 due to the diffusion or mixing or the like of the oxygen atoms and the like contained in the spin barrier layer 18 into the storage layer 17 can be suppressed.

As the material for the non-magnetic metallic layer 23 provided between the storage layer 17 and the spin barrier layer 18, there can be used a non-magnetic metal which itself shows little spin pumping effect, for example, Cu, Ta or the like. Further, use of such metals as Al, Si, Ti, Zn, Zr, Nb, Mo, Hf, W, and Ru may also be considered.

The non-magnetic metallic layer 23 also is desirably so configured that the above-mentioned degraded characteristics region would not be widely formed in the storage layer 17, by using a non-magnetic material not liable to diffuse into the ferromagnetic material of the storage layer 17, or by setting the film thickness of the non-magnetic metallic layer 23 to be sufficiently small, as compared with the above-mentioned electrode layer, under layer, cap layer 19 and the like.

The other configurations of the storage element 50 are the same as those of the storage element 3 in the preceding embodiment shown in FIG. 2 above, so that they are denoted by the same symbols as used above and descriptions of them are omitted.

In addition, a memory configured in the same manner as the memory shown in FIG. 1 can be configured by use of the storage elements 50 according to the present embodiment.

Specifically, the storage elements 50 are arranged near intersections between two kinds of address wirings, and currents in the vertical direction (lamination direction) are passed in some of the storage elements 50 by way of the two kinds of wirings, to reverse the direction of magnetization M1 of the storage layer 17 by spin injection, whereby information can be recorded in the storage elements 50.

This is advantageous in that a general semiconductor MOS forming process can be applied at the time of manufacturing the memory including the storage elements 50, and the memory including the storage elements 50 according to the present embodiment can be applied as a general-purpose memory.

According to this embodiment as above-described, the spin barrier layer 18 is provided on the side, opposite to the pinned magnetization layer 31, of the storage layer 17. Like in the cases of the storage elements 3, 30, and 40 according to the previous embodiments, the spin pumping phenomenon at the time of reversal of the direction of magnetization M1 of the storage layer 17 is restrained, and the spin injection efficiency can be enhanced.

Besides, like in the previous embodiments, the thermal stability of the storage layer 17 can be enhanced, so that it is possible to secure a wide operation margin and to permit the storage element 50 to operate stably.

Furthermore, according to the present embodiment, the non-magnetic metallic layer 23 is provided between the spin barrier layer 18 and the storage layer 17; therefore, variations in the magnetic properties of the storage layer 17 due to the diffusion or mixing or the like of the oxygen atoms and the like contained in the spin barrier layer 18 into the storage layer 17 can be restrained.

This ensures that the ferromagnetic material constituting the storage layer 17 can retain good magnetic properties intrinsic thereof, which also contributes to enhancement of the spin injection efficiency.

Therefore, it is possible to realize a memory which operates stably and is high in reliability, and to reduce the power consumption of the memory including the storage elements 50.

In the present invention, the film configurations of the storage elements 3, 30, 40, and 50 shown in the embodiments above are not limitative, and various film configurations can be adopted.

Here, in the configurations of the storage elements according to the embodiments of the present invention, their characteristics were examined by specifically selecting the material, film thickness and the like of each layer.

A practical memory includes semiconductor circuits for switching and the like in addition to the storage elements as shown in FIG. 1, but, here, investigations were conducted on a wafer provided only with the storage elements, for the purpose of examining the magnetization reversal characteristics of the storage layer.

Experiment 1

Examples

A 2 μm-thick thermal oxide film was formed on a 0.575 mm-thick silicon substrate, and a storage element 40 configured as shown in FIG. 4 was formed thereon.

Specifically, in the storage element 40 configured as shown in FIG. 4, the material and film thickness of each layer were selected as follows. The under layer 11 was composed of a 3 nm-thick Ta film, the antiferromagnetic layer 12 was composed of a 30 nm-thick PtMn film, the ferromagnetic layer 13 for constituting the pinned magnetization layer 31 was composed of a 2.2 nm-thick CoFe film, the ferromagnetic layer 15 was composed of a 2 nm-thick CoFeB film, the non-magnetic layer 14 for constituting the pinned magnetization layer 31 of the laminate ferri structure was composed of a 0.8 nm-thick Ru film, the tunnel insulation layer 16 was composed of a 0.8 nm-thick MgO film, the ferromagnetic layers 17 and 22 for constituting the storage layer 33 were each composed of a 1 nm-thick CoFeB film, the non-magnetic layer 21 and the spin barrier layer 18 were each composed of a 0.8 nm-thick MgO film, and the cap layer 19 was composed of a 5 nm-thick Ta film.

In the just-mentioned film configuration, the composition of the CoFeB film was $Co_{48}Fe_{32}B_{20}$ (atom %), the composition of the CoFe film was $Co_{90}Fe_{10}$ (atom %), and the composition of the PtMn film was $Pt_{38}Mn_{62}$ (atom %).

The other layers than the tunnel insulation layer 16 and the spin barrier layer 18, both composed of an MgO film, were formed by a DC magnetron sputtering method.

The tunnel insulation layer 16 and the spin barrier layer 18, both composed of an MgO film, were formed by an RF magnetron sputtering method.

Furthermore, after the layers of the storage element 40 were formed, the product was heat treated in a heat treatment furnace in a magnetic field under the conditions of 10 kOe, 360° C., and for two hours, thereby to perform a normalizing heat treatment of the PtMn film provided as the antiferromagnetic layer 12.

Next, the word line portion was masked by photolithography, and thereafter the laminate film in other portions than the word line portion was subjected to selective etching using an Ar plasma, to form a word line (lower electrode). In this case, the other portions than the word line portion were etched down to a depth of 5 nm of the substrate.

Thereafter, a mask in the pattern of the storage element 40 was formed by an electron beam drawing apparatus, and the laminate film was subjected to selective etching, to form the storage element 40. The other portions than the storage element 40 portion were etched down to a depth of 10 nm of the antiferromagnetic layer 12.

Incidentally, in a storage element to be served to evaluation of characteristics, the resistance of the tunnel insulation layer has to be suppressed, since it is necessary to pass a sufficient current in the storage element so as to generate a spin torque necessary for magnetization reversal. In view of this, the pattern of the storage element 40 was set to be an elliptic shape with a minor axis of 90 nm and a major axis of 180 nm so that the storage element 40 would have an areal resistance of 20 $\Omega\mu m^2$.

Next, the other portions than the storage element 40 portion were insulated by sputtering $Al_2O_3$ in a thickness of about 100 nm thereon.

Thereafter, a bit line to be an upper electrode and measurement pads were formed by use of photolithography, to produce a sample of storage element 40.

By the just-mentioned manufacturing method, samples of storage element 40 differing in the material (non-magnetic element) for the non-magnetic layer 21 and in the film thickness of the non-magnetic layer 21 were prepared.

The non-magnetic element to be used for the non-magnetic layer 21 was selected to be any one of Ti, Ta, Nb, and Cr, and, for each magnetic element, six values of 0.1 nm, 0.2 nm, 0.3 nm, 0.4 nm, 0.5 nm, and 1.0 nm were selected as the film thickness of the non-magnetic layer 21, in preparing the samples. These film thickness values correspond to contents (atom %) of the non-magnetic element, based on the whole part of the storage layer 33, of 3%, 6%, 8%, 11%, 13%, and 26%, respectively.

Thus, four kinds of non-magnetic elements were used, and six values of film thicknesses were adopted for each non-magnetic element; therefore, a total of 24 kinds of samples were prepared.

In addition, as other Examples, also for the storage element 3 having the storage layer 17 not provided with the non-magnetic layer 21, as shown in FIG. 2, samples were prepared by the same manufacturing method as above, while setting the film thickness of the storage layer 17 at 2 nm.

Comparative Examples

Figure 7A:
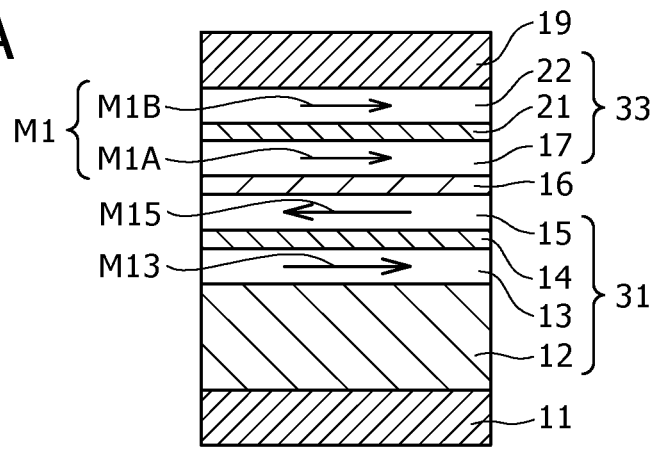
FIGS. 7A and 7B are sectional diagrams of storage elements in Comparative Examples.

Furthermore, as Comparative Examples, for the storage element the same as the storage element 40 shown in FIG. 4 except for being not provided with the spin barrier layer 18, as shown in a sectional diagram in FIG. 7A, 24 kinds of samples made to differ in the non-magnetic element of the non-magnetic layer 21 and in the film thickness of the non-magnetic layer 21 in the same manner as in Examples were prepared by the same manufacturing method as above.

Figure 7B:
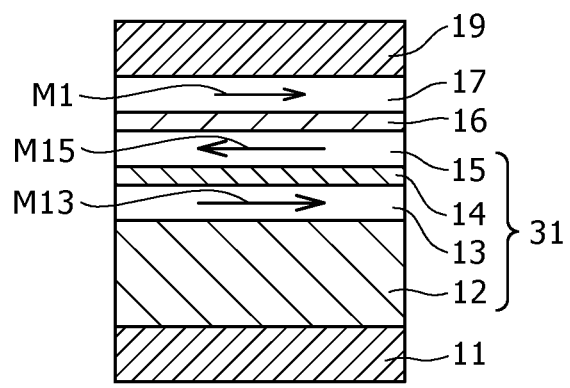

In addition, as other Comparative Examples, also for the storage element the same as the storage element 3 shown in FIG. 2 except for being not provided with the spin barrier layer 18, as shown in a sectional diagram in FIG. 7B, samples of storage element were prepared by the same manufacturing method as above, while setting the film thickness of the storage layer at 2 nm.

[Measurement of Thermal Stability Index Δ]

First, for the samples of storage element in Examples and Comparative Examples, the above-mentioned thermal stability index Δ was measured.

Figure 8:
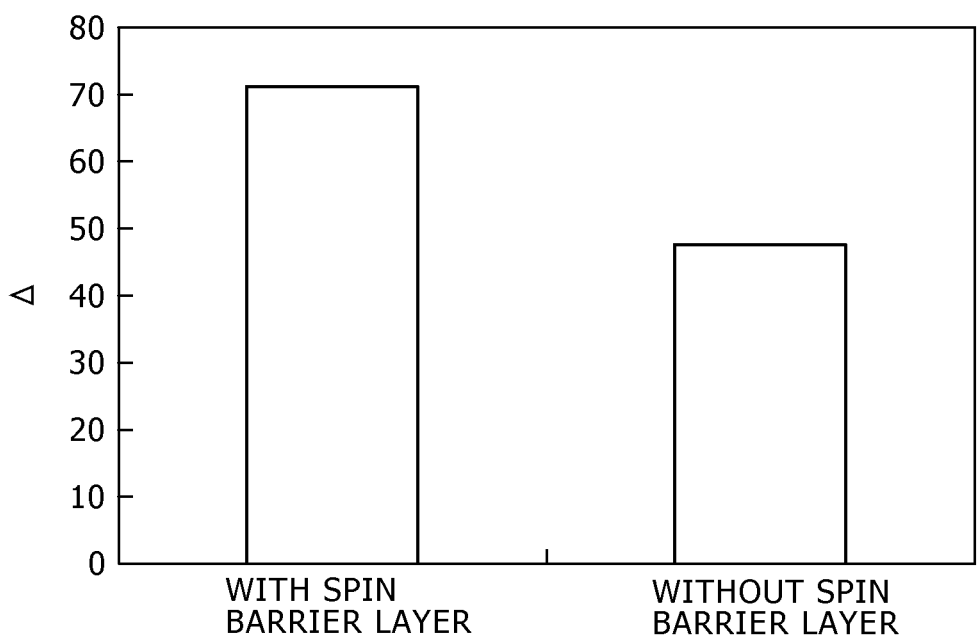
FIG. 8 is a diagram showing thermal stability indices of samples of storage elements according to Examples and Comparative Examples in Experiment 1.
Figure 9A:
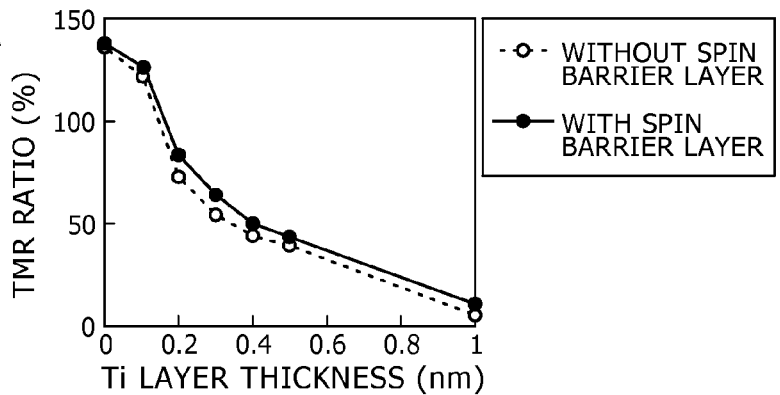
FIGS. 9A to 9D are diagrams showing the relationship between the thickness of a non-magnetic layer and TMR ratio, for samples of storage elements according to Examples and Comparative Examples in Experiment 1.
Figure 9B:
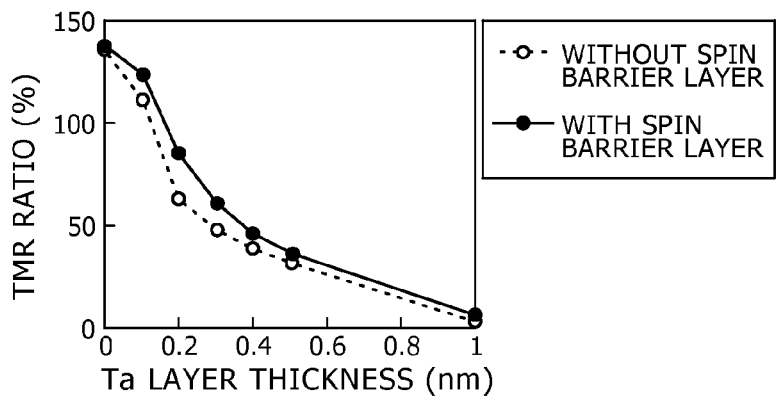
Figure 9C:
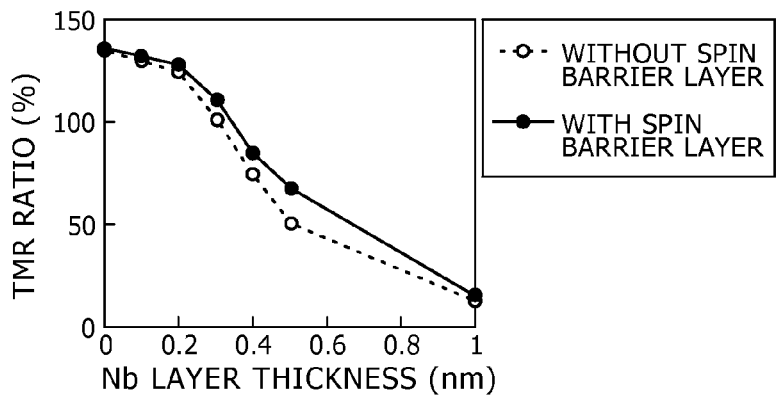
Figure 9D:
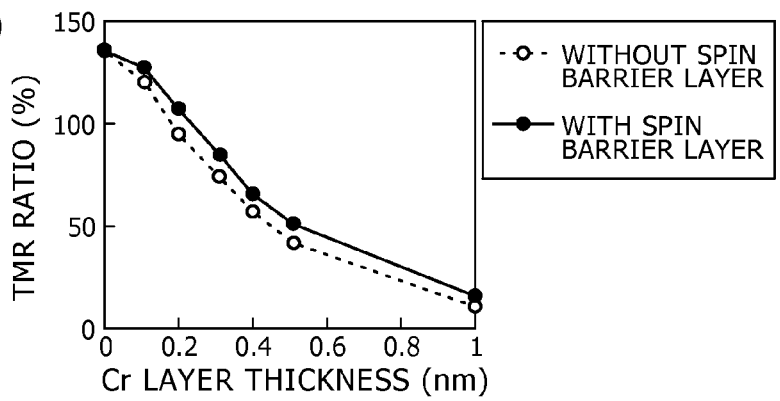
Figure 10A:
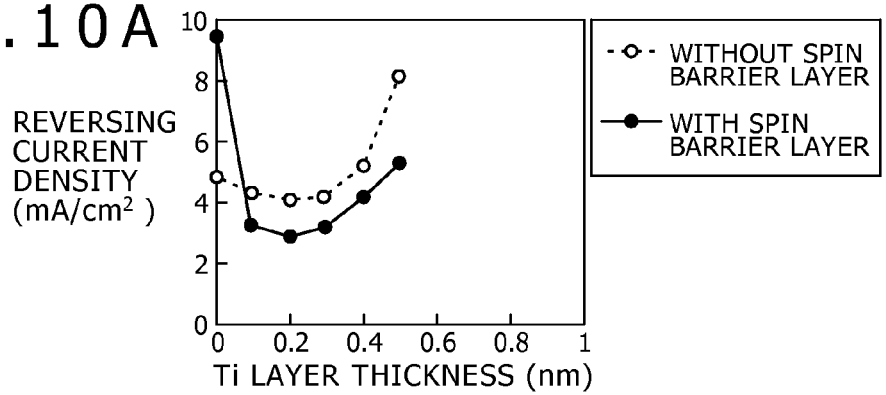
FIGS. 10A to 10D are diagrams showing the relationship between the thickness of the non-magnetic layer and reversing current density, for samples of storage elements according to Examples and Comparative Examples in Experiment 1.
Figure 10B:
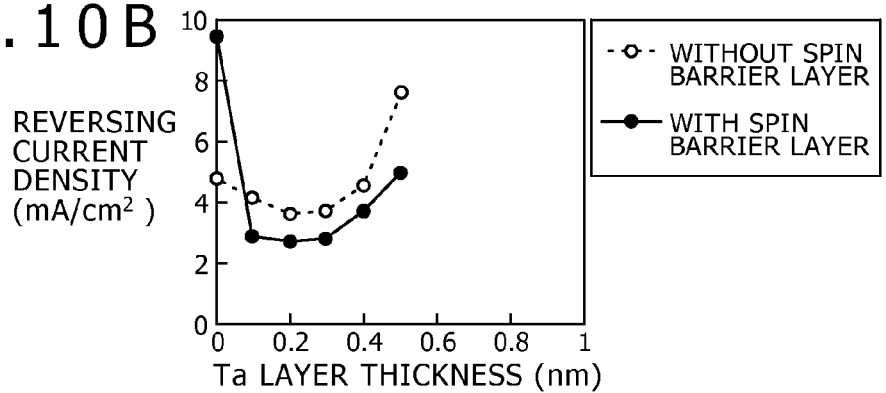
Figure 10C:
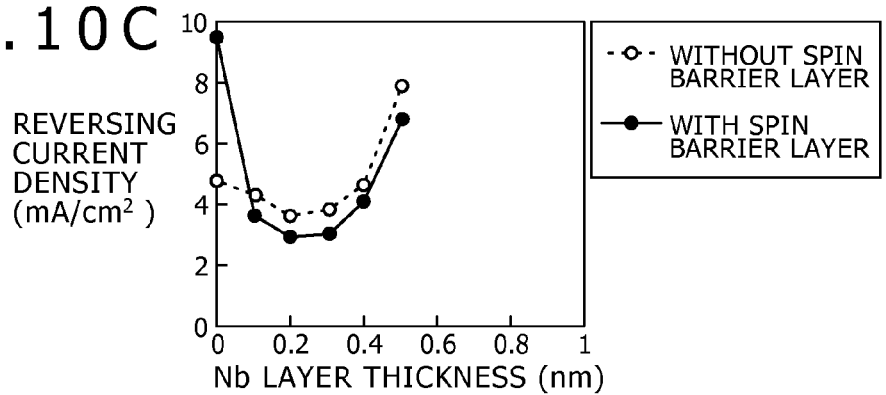
Figure 10D:
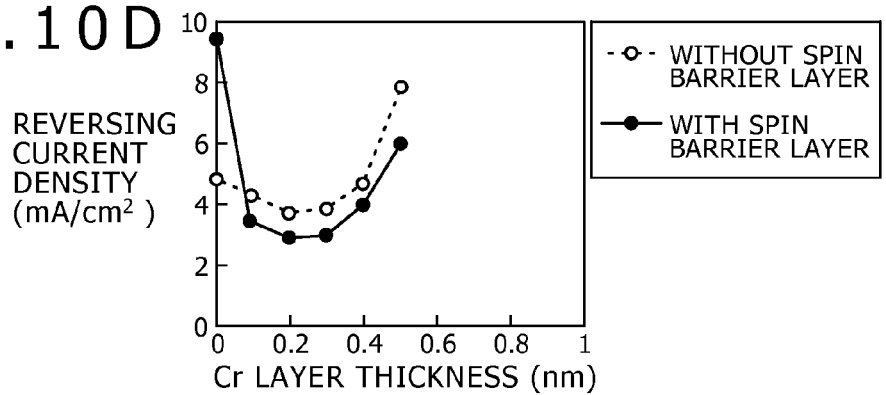

For the cases where the non-magnetic element of the non-magnetic layer 21 constituting the storage layer 33 was Ti and the film thickness of the non-magnetic layer 21 is 0.2 nm, the measurement results for the sample (of the storage element 40 shown in FIG. 4) with the spin barrier layer 18 and the sample (of the storage element shown in FIG. 7A) without the spin barrier layer 18 are shown in FIG. 8.

As seen from FIG. 8, the thermal stability index Δ is about 48 in the case of the sample without the spin barrier layer 18 and is increased to about 71 in the case of the sample with the spin barrier layer 18. This means an enhancement of the thermal stability, indicating that the thermal stability of the storage element can be enhanced by providing the spin barrier layer 18. Usually, for use as a storage element, it is desirable that the thermal stability index Δ is not less than 70.

The same or equivalent results were obtained also in the cases where the non-magnetic element and the film thickness were other than the above-mentioned.

[Measurement of TMR Ratio]

For the purpose of evaluating the read characteristics of storage elements, measurement of TMR ratio was conducted by the following method.

Measurement of resistance was conducted in the condition where a voltage of 100 mV was impressed on the storage element while applying an AC magnetic field of 10 Hz in the major axis direction of the storage element.

When the direction of magnetization M1 of the storage layer 33 is reversed by an external magnetic field, the resistance of the storage element is varied. Here, there was adopted a definition of TMR ratio=[R(anti-parallel)−R(parallel)]/R(parallel), where R(anti-parallel) is the resistance in the case where the direction of magnetization M1 of the storage layer 33 is anti-parallel to the direction of magnetization M15 of the ferromagnetic layer 15 (on the storage layer 33 side) of the pinned magnetization layer 31, and R(parallel) is the resistance in the case where the direction of magnetization M1 is parallel to the direction of magnetization M15.

The measurement of the TMR ratio was conducted for the samples of storage element in Examples and Comparative Examples.

The measurement results of TMR ratio are shown in FIGS. 9A to 9D. FIGS. 9A to 9D each show the relationship between the thickness (film thickness) of the non-magnetic layer 21 and the TMR ratio, in the cases where the non-magnetic layer 21 was Ti layer (FIG. 9A), Ta layer (FIG. 9B), Nb layer (FIG. 9C), and Cr layer (FIG. 9D), respectively. In each of the figures, the TMR ratio of the sample of the storage element 3 shown in FIG. 2 and the TMR ratio of the sample of the storage element shown in FIG. 7B are presented as the cases where the thickness of the non-magnetic layer 21 was 0 nm. In each of the figures, mark ○ indicates a sample of the storage element not provided with the spin barrier layer 18 (Comparative Example), and mark ● indicates a sample of the storage element provided with the spin barrier layer 18 (Example).

As seen from FIGS. 9A to 9D, the TMR ratio tends to decrease with an increase in the amount of the non-magnetic element added. Particularly, in the cases where the film thickness of the non-magnetic layer 21 is 1.0 nm, the TMR ratio is at or below 10%, indicating the substantial disappearance of the TMR ratio; this means that the record reading operation of reading the magnetization state by utilizing the difference in resistance is difficult to carry out and, therefore, the storage element may not be adopted as a satisfactory storage element.

From this it is seen that an upper limit is present as to the amount of the non-magnetic element added, and a desirable upper limit to the addition amount of the non-magnetic element is 20 atom %.

Besides, comparing at the same film thickness (addition amount), for every one of the non-magnetic elements, the TMR ratio of the sample provided with the spin barrier layer 18 (Example) is higher than the TMR ratio of the sample not provided with the spin barrier layer 18 (Comparative Example).

[Measurement of Reversing Current]

For the purpose of evaluating the write characteristics of the storage elements, measurement of reversing current was conducted.

Specifically, a current with a pulse width of 10μ to 100 ms was passed in the storage element, and the resistance of the storage element thereafter was measured. In measuring the resistance of the storage element, the temperature was set at a room temperature of 25° C., and a bias voltage impressed on the terminal of the word line and the terminal of the bit line was controlled to be 10 mV. Further, the current passed in the storage element was varied, to determine the current at which the magnetization of the storage layer was reversed. The value obtained by extrapolation of the pulse width dependence of this current to a pulse width of 1 ns was obtained as the reversing current.

For taking into account the dispersion (scattering) of the measurements among the storage elements, about 20 storage elements having the same configuration were prepared, they were subjected to the measurement of the reversing current, and an average of the measurements was obtained. Further, the average reversing current was divided by the sectional area, in the film plane direction, of the storage element, to obtain the reversing current density.

The measurement results of the reversing current density are shown in FIGS. 10A to 10D. FIGS. 10A to 10D each show the relationship between the thickness (film thickness) of the non-magnetic layer 21 and the TMR ratio, in the cases where the non-magnetic layer 21 was Ti layer (FIG. 10A), Ta layer (FIG. 10B), Nb layer (FIG. 10C), and Cr layer (FIG. 10D), respectively. In each of the figures, the TMR ratio of the sample of the storage element 3 shown in FIG. 2 and the TMR ratio of the sample of the storage element shown in FIG. 7B are presented as the cases where the thickness of the non-magnetic layer 21 was 0 nm. In each of the figures, mark ○ indicates a sample of the storage element not provided with the spin barrier layer 18 (Comparative Example), and mark ● indicates a sample of the storage element provided with the spin barrier layer 18 (Example).

As seen from FIGS. 10A to 10D, both in the cases of the samples without the spin barrier layer 18 (Comparative Examples) and in the cases of the samples with the spin barrier layer 18 (Examples), it is possible, by configuring the storage layer 33 by inserting a non-magnetic layer 21 having a certain thickness, to reduce the reversing current density, as compared with the cases where the non-magnetic layer 21 is not inserted.

This is presumed to indicate that the insertion of the non-magnetic layer 21 reduced the saturation magnetization Ms of the storage layer 33, resulting in the decrease in the reversing current density.

In addition, in the configuration where the non-magnetic layer 21 was inserted, the reversing current density was smaller in the case of the sample with the spin barrier layer 18 (Example) than in the case of the sample without the spin barrier layer 18 (Comparative Example), for every one of the film thickness values. In other words, the effect of provision of the spin barrier layer 18 is being demonstrated.

Incidentally, for the samples in which the film thickness of the non-magnetic layer 21 was 1.0 nm, magnetization reversal was not confirmed. This is considered to indicate that the reversing current density increases as the film thickness of the non-magnetic layer 21 is increased, but, when the film thickness reaches or exceeds a certain value, the reversing current density converges to infinity, i.e., the reversal would not occur.

On the other hand, of the cases of the samples with the spin barrier layer 18 in Experiments, in the cases where the non-magnetic layer 21 was not inserted (the storage element 3 shown in FIG. 2), the reversing current density was high.

This is considered to indicate that the passage of the spin polarized electrons is somewhat restricted due to the presence of the spin barrier layer 18, while it is made difficult for the reversal of the direction of magnetization M1 to occur, due to the large value of saturation magnetization Ms at the film thickness of the storage layer 17 of 2 nm, and, because of the balance between these points, the reversing current density is made to be very high.

Incidentally, even where the non-magnetic layer 21 is not inserted, the presence of the spin barrier layer 18 restrains the spin pumping phenomenon, as above-mentioned, whereby the effect of enhancing the spin injection efficiency and enhancing the thermal stability can be obtained.

Therefore, in order to suppress the reversing current density to a low level in the case where the spin barrier layer 18 is provided but the non-magnetic layer 21 is not inserted, it may be necessary to select the film thickness of the spin barrier layer 18 or the film thickness of the storage layer (ferromagnetic layer) 17 in such a manner that the passage of the spin polarized electrons would not be restrained and that the saturation magnetization Ms of the storage layer 17 would not be increased considerably. For example, it may be contemplated to set the film thickness of the spin barrier layer 18 or the film thickness of the storage layer (ferromagnetic layer) 17 at a value smaller than that in this Example.

The above results have made it clear that the reversing current density can be reduced by configuring the storage layer 33 by providing the spin barrier layer 18 for the storage layer 33 and inserting the non-magnetic layer 21 between the ferromagnetic layers 17 and 22, as shown in FIG. 4.

For obtaining such an effect as above, it suffices for the amount of the non-magnetic element added to the spin barrier layer 18 to be not less than 1 atom %.

Incidentally, the inclination of the current pulse width dependence of the reversing current corresponds to the above-mentioned thermal stability index Δ of the storage element.

As the reversing current varies less with the pulse width (the inclination is smaller), the value of the thermal stability index Δ is higher, meaning that the storage element is more resistant to thermal disturbance.

Experiment 2

A 300 nm-thick thermal oxide film was formed on a 0.725 mm-thick silicon substrate, and a storage element 3 configured as shown in FIG. 2 was formed thereon. Besides, in forming the spin barrier layer 18 of the storage element 3, the high-resistance layer 41 and the non-magnetic metallic layer 42 were laminated, as shown in FIG. 5.

Specifically, in the storage element 3 configured as shown in FIG. 2, the material and film thickness of each layer were selected as follows. The under layer 11 was composed of a 3 nm-thick Ta film, the antiferromagnetic layer 12 was composed of a 20 nm-thick PtMn film, the ferromagnetic layer 13 for constituting the pinned magnetization layer 31 was composed of a 2 nm-thick CoFe film, the ferromagnetic layer 15 was composed of a 2.5 nm-thick CoFeB film, the non-magnetic layer 14 for constituting the pinned magnetization layer 31 of the laminate ferri structure was composed of a 0.8 nm-thick Ru film, the tunnel insulation layer 16 was composed of a 0.9 nm-thick magnesium oxide film, the storage layer 17 was composed of a 2 nm-thick CoFeB film, a film to be the spin barrier layer 18 was composed of a laminate layer including a magnesium oxide film serving as the high-resistance layer 41 and a 5 nm-thick Ti film serving as the non-magnetic metallic layer 42, and the cap layer 19 was composed of a 5 nm-thick Ta film. In addition, a 100 nm-thick Cu film not shown (to be a word line which will be described later) was provided between the under layer 11 and the antiferromagnetic layer 12.

In the just-mentioned film configuration, the composition of the PtMn film was $Pt_{50}Mn_{50}$ (atom %), the composition of the CoFe film was $Co_{90}Fe_{10}$ (atom %), and the ratio of Co:Fe:B in the CoFeB film was 50:30:20.

The other layers than the tunnel insulation layer 16 and the high-resistance layer 41, both composed of a magnesium oxide film, were formed by a DC magnetron sputtering method.

The tunnel insulation layer 16 and the high-resistance layer 41, both composed of a magnesium oxide (MgO) film, were formed by an RF magnetron sputtering method.

Furthermore, after the layers of the storage element 3 were formed, the product was heat treated in a heat treatment furnace in a magnetic field under the conditions of 10 kOe, 360° C., and for two hours, thereby to perform a normalizing heat treatment of the PtMn film provided as the antiferromagnetic layer 12, and the non-magnetic element was diffused from the non-magnetic metallic layer 42 into the high-resistance layer 41, to form the spin barrier layer 18.

Next, the word line portion was masked by photolithography, and thereafter the laminate film in other portions than the word line portion was subjected to selective etching using an Ar plasma, to form a word line (lower electrode). In this case, the other portions than the word line portion were etched down to a depth of 5 nm of the substrate.

Thereafter, a mask in the pattern of the storage element 3 was formed by an electron beam drawing apparatus, and the laminate film was subjected to selective etching, to form the storage element 3. The other portions than the storage element 3 portion were etched down to a level immediately above the Cu layer of the word line.

Incidentally, in a storage element to be served to evaluation of characteristics, the resistance of the tunnel insulation layer has to be suppressed, since it is necessary to pass a sufficient current in the storage element so as to generate a spin torque necessary for magnetization reversal. In view of this, the pattern of the storage element 3 was set to be an elliptic shape with a minor axis of 0.09 μm and a major axis of 0.18 μm so that the storage element 3 would have an areal resistance of 20 Ωμm$^2$.

Next, the other portions than the storage element 3 portion were insulated by sputtering $Al_2O_3$ in a thickness of about 100 nm thereon.

Thereafter, a bit line to be an upper electrode and measurement pads were formed by use of photolithography.

In this manner, a sample of storage element 3 was produced.

By the just-mentioned manufacturing method, samples of storage element 3 differing in the thickness of the magnesium oxide film of the high-resistance layer 41 to be the spin barrier layer 18 were prepared. Specifically, the samples of storage element 3 were prepared while setting the thickness of the magnesium oxide film after sputtering to be 0.5 nm, 0.7 nm, 0.9 nm, 1.1 nm, and 1.3 nm, respectively.

Incidentally, the thermal stability index Δ is determined by the saturation magnetization Ms and the film thickness of the storage layer 17 and the area of the storage element 3; in the conditions of this experiment, a value of about 70 is being secured.

Experiment 3

Samples of storage element 3 were prepared in the same manner as the samples of storage element 3 in Experiment 2, except that the non-magnetic metallic layer 42 to be the spin barrier layer 18 in the storage element 3 configured as shown in FIG. 2 was composed of a 5 nm-thick Ta film.

Then, samples differing in the thickness of the magnesium oxide film of the high-resistance layer 41 to be the spin barrier layer 18 were prepared. Specifically, samples of storage element 3 were prepared while setting the thickness of the magnesium oxide film after sputtering to be 0.5 nm, 0.7 nm, 0.9 nm, 1.1 nm, and 1.3 nm, respectively.

Experiment 4

Samples of storage element 3 were prepared in the same manner as the samples of storage element 3 in Experiment 3, except that the non-magnetic metallic layer 42 to be the spin barrier layer 18 in the storage element 3 configured as shown in FIG. 2 was composed of a 3 nm-thick Au film.

Then, samples differing in the thickness of the magnesium oxide film of the high-resistance layer 41 to be the spin barrier layer 18 were prepared. Specifically, samples of storage element 3 were prepared while setting the thickness of the magnesium oxide film after sputtering to be 0.5 nm, 0.7 nm, 0.9 nm, 1.1 nm, and 1.3 nm, respectively.

Experiment 5

In the storage element 30 having the configuration shown in FIG. 3, i.e., the so-called Dual structure in which pinned magnetization layer 31 and 32 are provided respectively on the lower and upper sides of a storage layer 17, the material and film thickness of each layer was selected as follows. The under layer 11 was composed of a 3 nm-thick Ta film, the antiferromagnetic layers 12 for constituting the lower pinned magnetization layer 31 and the upper pinned magnetization layer 32 were each composed of a 20 nm-thick PtMn film, the ferromagnetic layer 13 for constituting the pinned magnetization layer 31 was composed of a 2 nm-thick CoFe film, the ferromagnetic layer 15 was composed of a 2.5 nm-thick CoFeB film, the non-magnetic layer 14 for constituting the pinned magnetization layer 31 of the laminate ferri structure was composed of a 0.8 nm-thick Ru film, the tunnel insulation layer 16 was composed of a 0.9 nm-thick magnesium oxide film, the storage layer 17 was composed of a 2 nm-thick CoFeB film, a film to be the spin barrier layer 18 was composed of a laminate layer including a magnesium oxide film serving as the high-resistance layer 41 and a 5 nm-thick Ta film serving as the non-magnetic metallic layer 42, the ferromagnetic layer 20 of the pinned magnetization layer 32 was composed of a 2.5 nm-thick CoFe film, and the cap layer 19 was composed of a 5 nm-thick Ta film.

The other configurations and the manufacturing method were selected to be the same as in the cases of the samples of storage element 3 in Experiment 2; in this manner, the samples of storage element 30 in this experiment were prepared.

Then, samples differing in the thickness of the magnesium oxide film of the high-resistance layer 41 to be the spin barrier layer 18 were prepared. Specifically, samples of storage element 30 were prepared while setting the thickness of the magnesium oxide film after sputtering to be 0.5 nm, 0.7 nm, 0.9 nm, 1.1 nm, and 1.3 nm, respectively.

The samples of storage elements 3, 30 prepared in Experiments 2 to 5 as above-described were served to evaluation of characteristics, as follows.

[Measurement of TMR Ratio]

Measurement of TMR ratio was conducted for the samples of storage element, by the same measuring method as in Experiment 1.

[Measurement of Reversing Current]

For the purpose of evaluating the write characteristics of the storage elements 3, 30, measurement of reversing current was carried out.

Incidentally, for taking into account the dispersion of the reversing current among the storage elements 3, 30, 20 samples of each of the storage elements 3, 30 with the same configuration were prepared, they were served to measurement of the reversing current, and an average of the measurements was determined.

The measurement of the reversing current was conducted for the currents of both polarities (upward and downward).

As for the relationship between the direction of magnetization M1 of the storage layer 17 and the direction of magnetization M15 of the ferromagnetic layer 15 in the pinned magnetization layer 31, a reversal from the parallel state to the anti-parallel state occurs when the current is passed from the word line to the bit line, whereas a reversal from the antiparallel state to the parallel state occurs when the current is passed from the bit line to the word line.

The reversing current in the case of passing the current from the word line to the bit line was defined as $Ic^+$, whereas the reversing current in the case of passing the current from the bit line to the word line was defined as $Ic^-$.

Figure 11A:
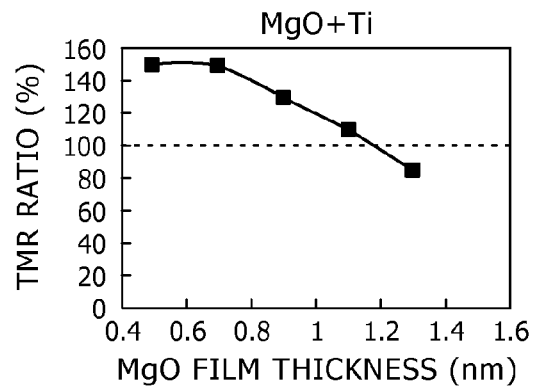
FIGS. 11A to 11D are diagrams showing the relationship between the thickness of an MgO film and TMR ratio, for samples of storage element in Experiments 2 to 5.
Figure 11B:
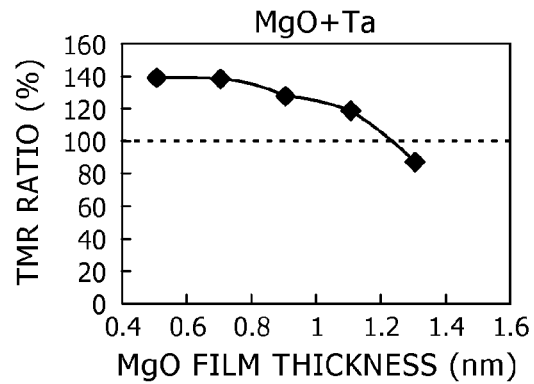
Figure 11C:
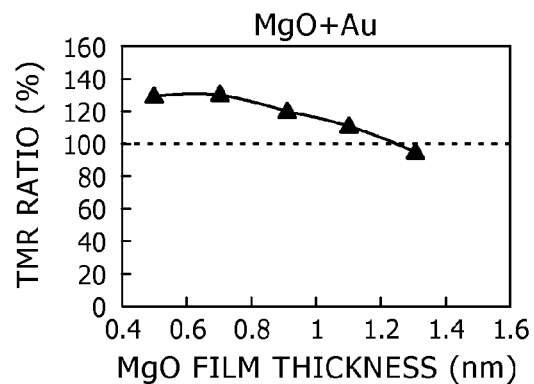
Figure 11D:
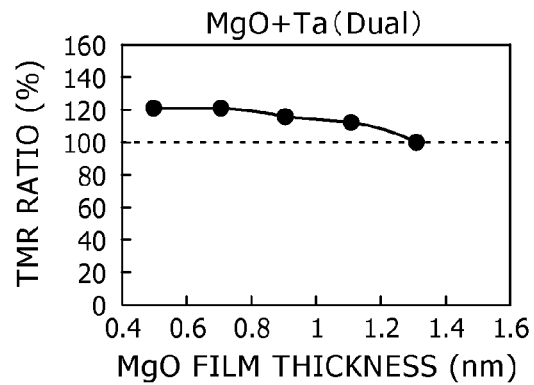

The results of measurement of TMR ratio for the samples of storage elements 3, 30 in Experiments 2 to 5 are shown in FIGS. 11A to 11D. FIGS. 11A to 11C show the cases where the non-magnetic metallic layer 42 was Ti layer, Ta layer, and Au layer, respectively, and FIG. 11D shows the case where the non-magnetic metallic layer 42 used for the spin barrier layer 18 in the Dual structure (the storage element 30 of FIG. 3) was Ta film.

Figure 12A:
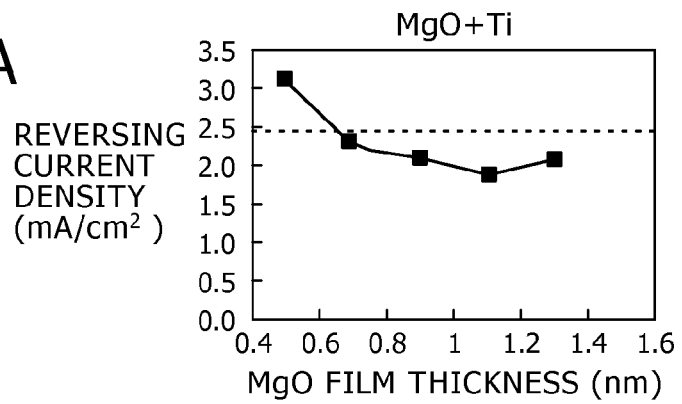
FIGS. 12A to 12D are diagrams showing the relationship between the thickness of the MgO film and reversing current density, for the samples of storage element in Experiments 2 to 5.
Figure 12B:
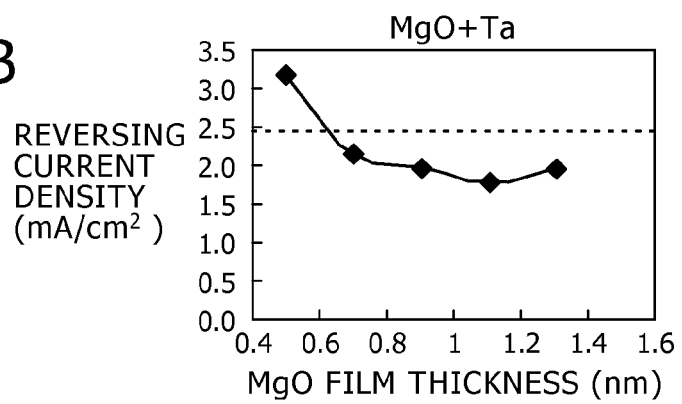
Figure 12C:
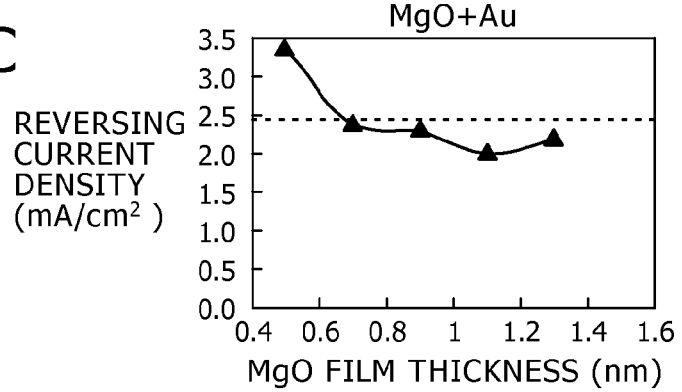
Figure 12D:
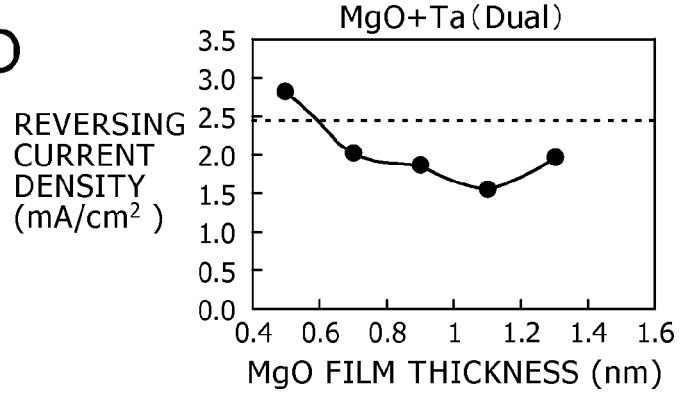

Besides, the results of measurement of reversing current density for the samples of storage elements 3, 30 in Experiments 2 to 5 are shown in FIGS. 12A to 12D. FIGS. 12A to 12C show the cases where the non-magnetic metallic layer 42 was Ti layer, Ta layer, and Au layer, respectively, and FIG. 12D shows the case where the non-magnetic metallic layer 42 used for the spin barrier layer 18 in the Dual structure (the storage element 30 of FIG. 3) was Ta film.

As seen from FIGS. 11A to 11D, the TMR ratio depends on the thickness of the MgO film of the high-resistance layer 41, before the heat treatment, for constituting the spin barrier layer 18. It is further seen that when the film thickness is large, the element resistance is raised by the spin barrier layer 18, with the result of a lowering in the TMR ratio.

The TMR ratio of 100% indicated by broken line in each of the figures is a value necessary for obtaining a reading speed and a margin in operation as a memory, and is in such a range that the characteristics of the memory can be maintained, even though the TMR ratio is sacrificed for improving the reversing current density.

Therefore, in the samples in Experiments 2 to 5, it is desirable to set the thickness of the MgO film of the high-resistance layer 41 to be not more than about 1.2 nm.

As seen from FIGS. 12A to 12D, the reversing current density also depends on the thickness of the MgO film of the high-resistance layer 41, before the heat treatment, for constituting the spin barrier layer 18. It is also seen that when the film thickness is small, the effect of the provision of the spin barrier layer 18 is reduced, with the result of a rise in the reversing current density.

The reversing current density of 2.5 mA/cm$^2$ indicated by broken line in each of the figures is a value necessary for realizing a memory utilizing the spin reversal, and a memory utilizing the spin reversal can be configured by setting the reversing current density to be not more than 2.5 mA/cm$^2$.

Therefore, in the samples in Experiments 2 to 5, it is desirable to set the thickness of the MgO film of the high-resistance layer 41 to be not more than about 0.7 nm.

When this is combined with the results shown in FIGS. 11A to 11D, the desirable range of the thickness of the MgO film of the high-resistance layer 41 to be the spin barrier layer 18 is from 0.7 to 1.2 nm.

From the experimental results as above, it is seen that, by providing the spin barrier layer 18 composed of an insulating material (magnesium oxide or the like) containing a non-magnetic element, it is possible to maintain an MR ratio of not less than 100% which is necessary for the reading operation of a memory, and to drastically reduce the reversing current density, which has been the greatest problem. Thus, for example, it is possible to produce the storage elements 3, 30 in which information can be written at a small current density of not more than 2.5 mA/cm$^2$.

Therefore, it is possible to realize a memory utilizing spin injection, of such a low power consumption type as not to be realizable according to the related art.

Experiment 6

Examples

A storage element 50 configured as shown in FIG. 6 was formed on a silicon substrate which had been provided with a thermal oxide film on a surface thereof.

Specifically, in the storage element 50 configured as shown in FIG. 6, the material and film thickness of each layer were selected as follows. The under layer 11 was composed of a 20 nm-thick Ta film, the antiferromagnetic layer 12 was composed of a 30 nm-thick PtMn film, the ferromagnetic layer 13 for constituting the pinned magnetization layer 31 of the laminate ferri structure was composed of a 2.2 nm-thick CoFe film, the non-magnetic layer 14 was composed of a 0.8 nm-thick Ru film, the ferromagnetic layer 15 was composed of a 2 nm-thick CoFeB film, the tunnel insulation layer 16 was composed of a 0.9 nm-thick MgO film, the storage layer 17 was composed of a 2.2 nm-thick CoFeB film, the non-magnetic metallic layer 23 was composed of a 0.2 nm-thick Cu film, the spin barrier layer 18 was composed of a 0.8 nm-thick MgO film, and the cap layer 19 was composed of a 10 nm-thick Ta film.

In the just-mentioned film configuration, the composition of the CoFeB film was $Co_{48}Fe_{32}B_{20}$ (atom %), the composition of the CoFe film was $Co_{90}Fe_{10}$ (atom %), and the composition of the PtMn film was $Pt_{38}Mn_{62}$ (atom %).

Each of these layers was formed by a magnetron sputtering method.

Further, after the layers of the storage element 50 were formed, the product was heat treated in a heat treatment furnace in a magnetic field under the conditions of 10 kOe, 340° C., and for two hours, to thereby perform a normalizing heat treatment of the PtMn film of the antiferromagnetic layer 12.

Next, a sample of storage element 50 having an elliptic pattern with a minor axis of about 110 nm and a major axis of about 170 nm was produced by use of such techniques as photolithography, electron beam drawing, and etching.

Besides, as other Examples, samples of storage element 3 having the storage layer 17 not provided with the non-magnetic metallic layer (Cu film) 23 as shown in FIG. 2 were produced by the same manufacturing method as above.

[Measurement of Reversing Current]

For the purpose of evaluating the write characteristics of the storage elements, measurement of reversing current was conducted.

As an index of the reversing current, there is adopted Jc0, which represents the reversing current density at the absolute temperature 0 K. Now, Jc0 will be described. In general, when it is intended to measure the magnetization reversal by spin injection (spin transfer) at a finite temperature, the effect of magnetization reversal by thermal disturbance would be superposed on the object of measurement, so that the effect of pure spin injection is difficult to discern. For example, a magnetic material extremely low in thermal stability is susceptible to magnetization reversal, but this reversal may not easily be regarded as the effect of spin injection (spin transfer), and such a magnetic material may not be used for a memory, from the viewpoint of retention of stored information.

If evaluation at an extremely low temperature near absolute 0 K can be carried out, the just-mentioned thermal disturbance problem is solved. The reversing current density in this case has a value which is close to Jc0 and does not contain the influence of thermal disturbance.

However, the evaluation at the extremely low temperature is attended by difficulties in measurement. In view of this, Jc0 was estimated by using an external magnetic field at the time of measurement.

Specifically, the measurement and estimation were carried out in the following procedure.

A predetermined external magnetic field is applied to the storage element, and a current in a direction perpendicular to the film plane of the laminate film is passed. When the magnitude of the current is varied under this condition, reversal of the direction of magnetization of the storage layer (magnetization reversal) occurs at a current of not less than a certain threshold (reversing current). This process is repeated by varying the magnitude of the external magnetic field.

Then, a situation comes to be obtained in which magnetization reversal under an external magnetic field of not less than a certain threshold occurs even with no current passed. This is the same magnetization reversal as that in the case of an ordinary MRAM.

The application of the external magnetic field is for controlling the energy barrier separating two stable energy states from each other, which determines the reversal due to thermal disturbance.

Then, by utilizing the dependence of the reversing current on the external magnetic field, the magnitude of Jc0 can be known (refer to, for example, Y. Higo et al., Appl. Phys. Lett 87 082502 (2005)).

First, for the samples in Examples (the storage element 50 of FIG. 6) in which the thickness of the non-magnetic metallic layer 23 was 0.2 nm, the measurement was conducted in the above-mentioned procedure, and the threshold current relevant to the reversal of the direction of magnetization M1 of the storage layer 17 was determined, for each value of the external magnetic field.

Figure 13:
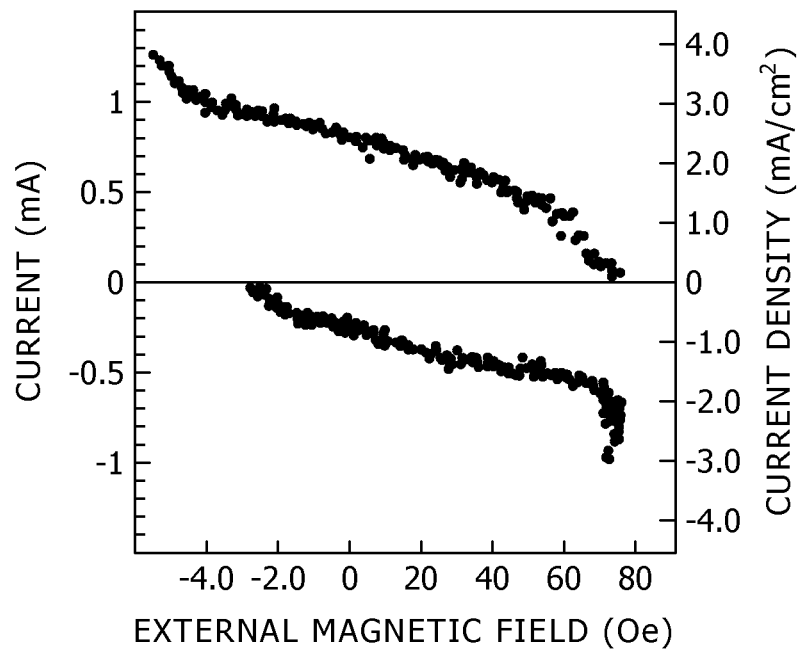
FIG. 13 is a diagram showing the relationship between external magnetic field and threshold current (reversing current), for samples in Examples provided with a non-magnetic metallic layer in Experiment 6.

The measurement results are shown in FIG. 13, in which external magnetic field is taken on the axis of abscissas, current is taken on the axis of ordinates, and the threshold current relevant to the reversal of the direction of magnetization M1 of the storage layer 17 is plotted. Incidentally, in FIG. 13, the current density computed from the passed current and the area of the storage element 50 is given on the axis of ordinates on the right side.

It is seen from FIG. 13 that the threshold current varies with the magnitude of the external magnetic field. It is also seen that, when an external magnetic field having a certain magnitude is applied, the magnetization reversal takes place even if the current is substantially zero.

For each of the storage elements in Examples, about 20 storage elements were prepared under the same conditions according to the above-mentioned procedure, they were subjected to measurement of the threshold current (reversing current) in the above-mentioned procedure, and an average of the measurements was determined. Further, the reversing current density was obtained by dividing the average reversing current by the sectional area, in the film plane direction, of the storage element.

Figure 14:
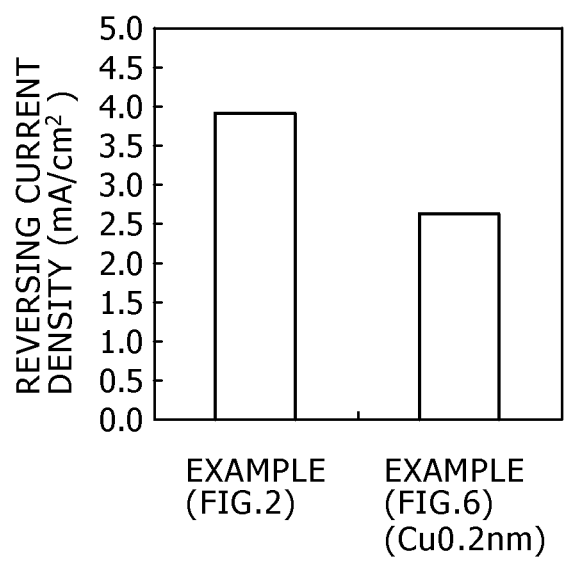
FIG. 14 is a diagram showing the reversing current density, for the samples of storage element in Experiment 6.
Figure 15:
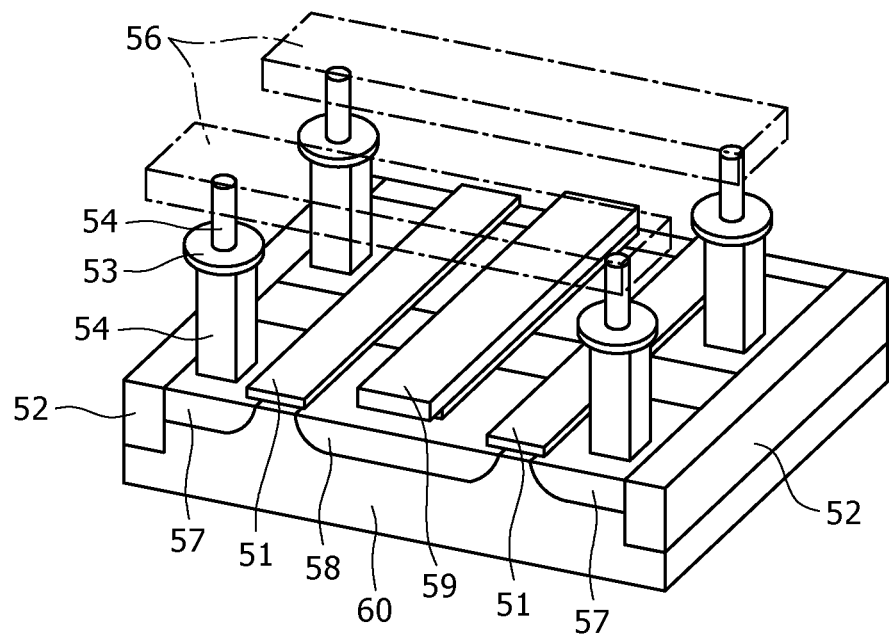
FIG. 15 is a schematic configuration diagram (perspective view) of a memory utilizing magnetization reversal by spin injection.
Figure 16:
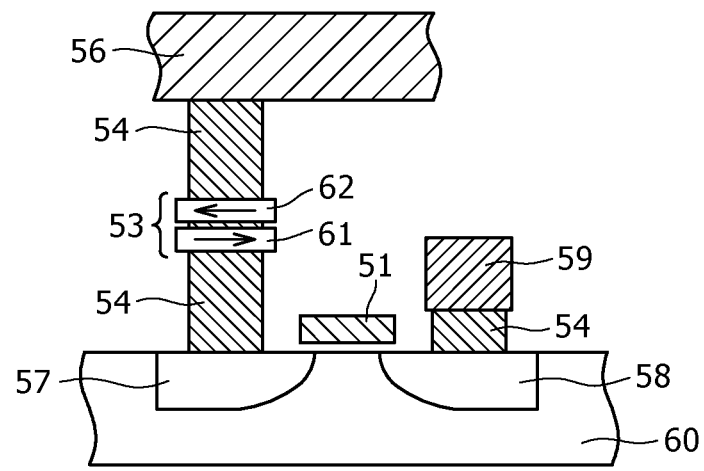
FIG. 16 is a sectional diagram of the memory shown in FIG. 15.

The measurement results of the reversing current density are shown in FIG. 14.

As seen from FIG. 14, of the samples in Examples, those with the configuration of the storage element 3 of FIG. 2, in which the storage layer 17 and the spin barrier layer 18 were laminated directly on each other, showed a reversing current density of 3.88 mA/cm$^2$.

Further, of the samples in Examples, those with the configuration of the storage element 50 of FIG. 6, in which the non-magnetic metallic layer 23 was provided between the storage layer 17 and the spin barrier layer 18, showed a reversing current density of 2.59 mA/cm$^2$.

From the above results, it is seen that the reversing current density can be reduced by providing the non-magnetic metallic layer 23 between the spin barrier layer 18 and the storage layer 17.

In the present invention, the film configurations of the storage elements 3, 30, 40, and 50 shown in the above-described embodiments are not limitative, and various film configurations can be adopted.

While the pinned magnetization layer 31 in the storage element has an exchange bias laminate ferri structure in the above embodiments, a single ferromagnetic layer may be used, and a laminate structure of antiferromagnetic layer/ferromagnetic layer or a laminate ferri structure not having an antiferromagnetic layer may also be used, without any problem, insofar as a satisfactory pinning of magnetization can be achieved.

Each ferromagnetic layer in the pinned magnetization layer is not limited to a single layer but may be a laminate film obtained by laminating a plurality of layers differing in material.

Besides, the storage element may be configured by laminating the layers in an order reverse to the order in the above-described embodiments.

The present invention is not limited to the above-described embodiments, and other various configurations can be adopted within the scope of the gist of the invention.

What is claimed is:

1. A storage element comprising, stacked in a laminate direction:
    a storage layer configured to hold information by means of a magnetization state of a magnetic material,
    a pinned magnetization layer on one side of said storage layer,
    a tunnel insulation layer between said storage layer and said pinned magnetization layer, and
    a spin barrier layer in contact with another side of said storage layer that faces away from said pinned magnetization layer and said tunnel insulation layer, said spin barrier layer comprising magnesium oxide and a non-magnetic metallic element diffused in the magnesium oxide, the non-magnetic metallic element being at least one selected from the group consisting of Ti, Ta, Zr, Hf, Nb, Cr, Mo, W, and V.

2. The storage element as set forth in claim 1, wherein said non-magnetic metallic element is distributed in a part of said spin barrier layer or throughout said spin barrier layer.

3. The storage element as set forth in claim 1, wherein said spin barrier layer has an areal resistance of not more than 10 $\Omega\mu m^2$.

4. The storage element as set forth in claim 1, wherein said non-magnetic metallic element contained in said spin barrier layer is at least one selected from the group including of Zr and Hf.

5. The storage element as set forth in claim 1, wherein said non-magnetic metallic element contained in said spin barrier layer is Ti.

6. The storage element as set forth in claim 1, wherein said non-magnetic metallic element contained in said spin barrier layer is Ta.

7. The storage element as set forth in claim 1, wherein said non-magnetic metallic element contained in said spin barrier layer is Zr.

8. The storage element as set forth in claim 1, wherein said non-magnetic metallic element contained in said spin barrier layer is Hf.

9. The storage element as set forth in claim 1, wherein said non-magnetic metallic element contained in said spin barrier layer is Nb.

10. The storage element as set forth in claim 1, wherein said non-magnetic metallic element contained in said spin barrier layer is Cr.

11. The storage element as set forth in claim 1, wherein said non-magnetic metallic element contained in said spin barrier layer is Mo.

12. The storage element as set forth in claim 1, wherein said non-magnetic metallic element contained in said spin barrier layer is W.

13. The storage element as set forth in claim 1, wherein said non-magnetic metallic element contained in said spin barrier layer is V.

14. The storage element as set forth in claim 1, wherein said storage layer includes a lamination with a plurality of ferromagnetic layers and a non-magnetic layer interposed between the ferromagnetic layers.

15. The storage element as set forth in claim 14, wherein said ferromagnetic layers of said storage layer contain CoFeB as a main constituent, said non-magnetic layer of said storage layer includes at least one non-magnetic element selected from the group including Ti, Ta, Nb, and Cr, and the content of said non-magnetic element in said storage layer is in the range of 1 to 20 atom %.

16. The storage element as set forth in claim 1, wherein said tunnel insulation layer includes magnesium oxide.

17. The storage element as set forth in claim 1, wherein said storage layer has a layer containing CoFeB as a main constituent.

18. A memory comprising:
storage elements each comprising, stacked in a laminate direction, (a) a storage layer configured to hold information by means of a magnetization state of a magnetic material, (b) a pinned magnetization layer on one side of said storage layer, (c) a tunnel insulation layer between said storage layer and said pinned magnetization layer, and (d) a spin barrier layer in contact with another side of said storage layer that faces away from said pinned magnetization layer and said tunnel insulation layer, said spin barrier layer comprising magnesium oxide and a non-magnetic metallic element diffused in the magnesium oxide, the non-magnetic metallic element being at least one selected from the group consisting of Ti, Ta, Zr, Hf, Nb, Cr, Mo, W, and V; and
two wirings that run along intersecting directions.

* * * * *